(12) United States Patent
Tani

(10) Patent No.: US 9,640,267 B2
(45) Date of Patent: May 2, 2017

(54) SEMICONDUCTOR DEVICE, PRE-WRITE PROGRAM, AND RESTORATION PROGRAM

(71) Applicant: RENESAS ELECTRONICS CORPORATION, Kawasaki-shi, Kanagawa (JP)

(72) Inventor: Kunio Tani, Kawasaki (JP)

(73) Assignee: RENESAS ELCTRONICS CORPORATION, Tokyo (JP)

( * ) Notice: Subject to any disclaimer, the term of this patent is extended or adjusted under 35 U.S.C. 154(b) by 59 days.

(21) Appl. No.: 14/430,428

(22) PCT Filed: Mar. 31, 2014

(86) PCT No.: PCT/JP2014/059546
§ 371 (c)(1),
(2) Date: Mar. 23, 2015

(87) PCT Pub. No.: WO2015/151197
PCT Pub. Date: Oct. 8, 2015

(65) Prior Publication Data
US 2016/0260486 A1     Sep. 8, 2016

(51) Int. Cl.
*G11C 16/06* (2006.01)
*G11C 16/14* (2006.01)
(Continued)

(52) U.S. Cl.
CPC .......... *G11C 16/14* (2013.01); *G11C 16/0416* (2013.01); *G11C 16/0425* (2013.01);
(Continued)

(58) Field of Classification Search
CPC ................................................. G11C 16/3445
(Continued)

(56) References Cited

U.S. PATENT DOCUMENTS

| | | | | |
|---|---|---|---|---|
| 2003/0048667 A1* | 3/2003 | Mori | .................... | G11C 16/107 365/185.33 |
| 2004/0240254 A1* | 12/2004 | Shiga | .................. | G11C 16/107 365/154 |

(Continued)

FOREIGN PATENT DOCUMENTS

| | | |
|---|---|---|
| JP | 2008-117510 A | 5/2008 |
| JP | 2014-44788 A | 3/2014 |

OTHER PUBLICATIONS

English translation International Search Report PCT/JP2014/059546 dated Jun. 24, 2014.

*Primary Examiner* — Hoai V Ho
(74) *Attorney, Agent, or Firm* — McDermott Will & Emery LLP

(57) ABSTRACT

When a control circuit has received a first erase command, the control circuit controls performing a first pre-write process to allow a first storage device and a second storage device to have threshold voltages, respectively, both increased, and the control circuit thereafter controls performing an erase process to allow the first storage device and the second storage device to have their respective threshold voltages both decreased to be smaller than a prescribed erase verify level. When the control circuit has received a second erase command, the control circuit controls performing a second pre-write process to allow one of the first storage device and the second storage device to have its threshold voltage increased, and control circuit subsequently controls performing the erase process.

6 Claims, 18 Drawing Sheets

(51) Int. Cl.
   *G11C 16/22*   (2006.01)
   *G11C 16/04*   (2006.01)
   *G11C 16/34*   (2006.01)

(52) U.S. Cl.
   CPC ............ *G11C 16/22* (2013.01); *G11C 16/344* (2013.01); *G11C 16/3445* (2013.01)

(58) Field of Classification Search
   USPC .................................................... 365/185.22
   See application file for complete search history.

(56) References Cited

U.S. PATENT DOCUMENTS

2007/0047307 A1\* 3/2007 Ogura ................ G11C 16/0475
                                                        365/185.11
2009/0090961 A1\* 4/2009 Ajika .................... H01L 29/792
                                                        257/324

\* cited by examiner

FIG.5
(a)
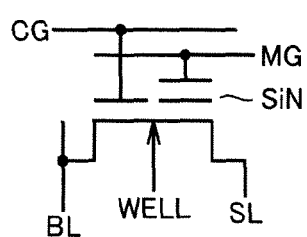
|  | BL | CG | MG | SL | WELL | |
|---|---|---|---|---|---|---|
| READ | 1.5V | 1.5V | 0V | 0V | 0V | |
| RAISE Vth | 0V | 0.9V | 10V | 6V | 0V | (IN BITS) |
| LOWER Vth | 1.5V | 0V | -10V | 6V | 0V | (IN ONE STEP) |
(b)
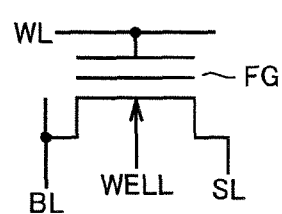
|  | BL | WL | SL | WELL | |
|---|---|---|---|---|---|
| READ | 1.5V | 1.5V | 0V | 0V | |
| RAISE Vth | 6V | 10V | 0V | 0V | (IN BITS) |
| LOWER Vth | 10V | -10V | 10V | 10V | (IN ONE STEP) |
(c)
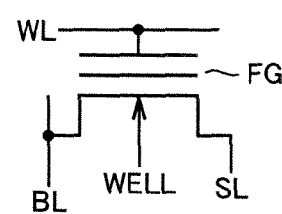
|  | BL | WL | SL | WELL | |
|---|---|---|---|---|---|
| READ | 1.5V | 1.5V | 0V | 0V | |
| RAISE Vth | -10V | 10V | -10V | -10V | (IN ONE STEP) |
| LOWER Vth | 10V | -10V | 0V | 0V | (IN BITS) |

FIG.18

| Step0 | START |
| --- | --- |
| Step1 | SET REGISTER TO SUPPLY VSP & VSN WITH WVER2 |
| Step2 | ADR=LEADING ADDRESS OF BLOCK TO BE ERASED |
| Step3 | READ ADR DATA |
| Step4 | WRITE ADR /DATA |
| Step5 | ADR=ADR+1 |
| Step6 | IF ADR=INTERMEDIATE ADDRESS OF BLOCK TO BE ERASED    YES: go to Step7, NO: go to Step4 |
| Step7 | READ ADR DATA |
| Step8 | WRITE ADR /DATA |
| Step9 | ADR=ADR+1 |
| Step10 | IF ADR=(FINAL ADDRESS + 1) OF BLOCK TO BE ERASED    YES: go to Step11, NO: go to Step8 |
| Step11 | END |

FIG.19

| Step0 | START |
|---|---|
| Step1 | ADR=LEADING ADDRESS OF BLOCK TO BE RESTORED |
| Step2 | READ ADR DATA |
| Step3 | WRITE ADR DATA |
| Step4 | ADR=ADR+1 |
| Step5 | IF ADR=(FINAL ADDRESS + 1) OF BLOCK TO BE RESTORED     YES: go to Step6, NO: go to Step2 |
| Step6 | END |

SEMICONDUCTOR DEVICE, PRE-WRITE PROGRAM, AND RESTORATION PROGRAM

CROSS REFERENCE TO RELATED APPLICATIONS

This application is the U.S. National Phase of PCT/JP2014/059546 filed Mar. 31, 2014 the subject matter of which is incorporated herein by reference in entirety.

TECHNICAL FIELD

The present invention relates to a semiconductor device, a pre-write program, and a restoration program, and relates for example to a semiconductor device including two nonvolatile memory cells holding complementary data, a pre-write program for erasing the complementary data, and a program that restores the complementary data.

BACKGROUND ART

Conventionally, a semiconductor device has been known to include two nonvolatile memory cells holding complementary data.

For example, Japanese Patent Laying-Open No. 2008-117510 (PTD 1) describes a semiconductor device comprising: a memory array (19) including a plurality of 1-bit twin cells each composed of electrically rewritable first and second storage devices (MC1 and MC2) holding binary data according to a difference of their flash erase type negative threshold voltages and having different retention characteristics depending on a difference of the binary data held thereby; and a read circuit (SA) for differentially amplifying complementary data output from the first and second storage devices of a twin cell that is selected for a read, and determining information stored in the twin cell.

CITATION LIST

Patent Document

PTD 1: Japanese Patent Laying-Open No. 2008-117510

SUMMARY OF INVENTION

Technical Problem

When the twin cell described in Japanese Patent Laying-Open No. 2008-117510 (PTD 1) has twin cell data erased therefrom, the twin cell has its two cells with their threshold voltages both set to be small. Note that before the twin cell data is erased, i.e., when the two cells are in a written state, the cells have threshold voltages, respectively, with a difference therebetween, and this difference may be retained after the twin cell data is erased.

A user may desire to erase twin cell data (to vacate an area) to simply, additionally write data or may desire to erase twin cell data for confidentiality. For the former, it does not matter if the two cells' difference in threshold voltage is retained after the twin cell data is erased. For the latter, however, if the two cells' difference in threshold voltage is retained after the twin cell data is erased, the written state assumed before the twin cell data was erased can be read, which is not preferable in terms of confidentiality.

Other issues and novel features will be apparent from the description below and the accompanying drawing.

Solution to Problem

According to one embodiment of the present invention, when a control circuit has received a first erase command, the control circuit controls performing a first pre-write process to allow a first storage device and a second storage device to have their respective threshold voltages both increased, and the control circuit thereafter controls performing an erase process to allow the first storage device and the second storage device to have their respective threshold voltages both decreased to be smaller than a prescribed erase verify level. When the control circuit has received a second erase command, the control circuit controls performing a second pre-write process to allow one of the first storage device and the second storage device to have its threshold voltage increased, and the control circuit thereafter controls performing the erase process.

Advantageous Effect of Invention

The present invention in one embodiment can accommodate both a request of a user to erase twin cell data (to vacate an area) to simply, additionally write data and a request of the user to erase twin cell data for confidentiality.

BRIEF DESCRIPTION OF DRAWINGS

FIG. 5($a$) shows an example of a bias voltage applied to a split gate type flash memory device. FIG. 5($b$) shows an example of a bias voltage applied to a stacked gate type flash memory device employing a hot carrier writing system. FIG. 5($c$) shows an example of a bias voltage applied to a stacked gate type flash memory device employing an FN tunnel writing system.

FIG. 6($b$) shows a state with twin cell data having "1" stored therein. FIG. 6($c$) shows twin cell data initialized.

FIG. 10($b$) shows how the threshold voltage varies in a write for programming data of "0."

FIG. 12($b$) shows how the threshold voltage varies when block erase 1 starts from a state with data of "0" stored.

FIG. 18 shows a procedure of a process of a pre-write program.

FIG. 19 shows a procedure of a process of a restoration program.

DESCRIPTION OF EMBODIMENTS

The present invention will hereinafter be described in embodiments with reference to the drawings.

First Embodiment

Figure 1:
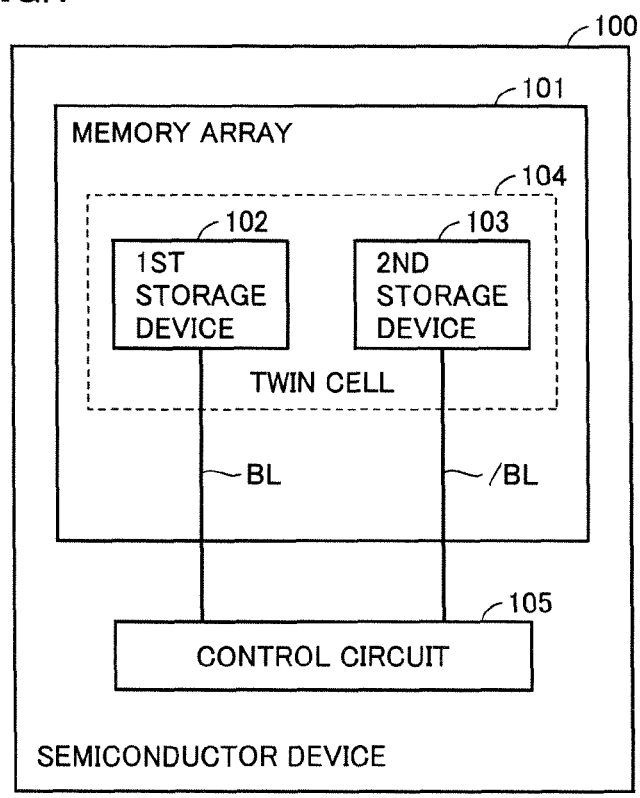
FIG. 1 shows a configuration of a semiconductor device of a first embodiment.

FIG. 1 shows a configuration of a semiconductor device of a first embodiment. A semiconductor device 100 includes a memory array 101 and a control circuit 105.

Memory array 101 includes a plurality of twin cells 104. Twin cell 104 is composed of electrically rewritable, first and second storage devices 102 and 103 holding binary data (or twin cell data) depending on a difference between first storage device 102 and second storage devices 103 in threshold voltage Vth.

Control circuit 105 controls erasing the twin cell data. When control circuit 105 has received an externally transmitted, first erase command, control circuit 105 controls performing a first pre-write process to allow first storage device 102 and second storage device 103 to both have threshold voltage Vth increased. Thereafter, control circuit 105 controls performing an erase process to allow first storage device 102 and second storage device 103 to both have threshold voltage Vth decreased to be smaller than a prescribed erase verify level.

When control circuit 105 has received an externally transmitted, second erase command, control circuit 105 controls performing a second pre-write process to allow one of first storage device 102 and second storage device 103 to have threshold voltage Vth increased. Thereafter, control circuit 105 controls performing the erase process to allow first storage device 102 and second storage device 103 to both have threshold voltage Vth decreased to be smaller than the prescribed erase verify level.

Figure 2:
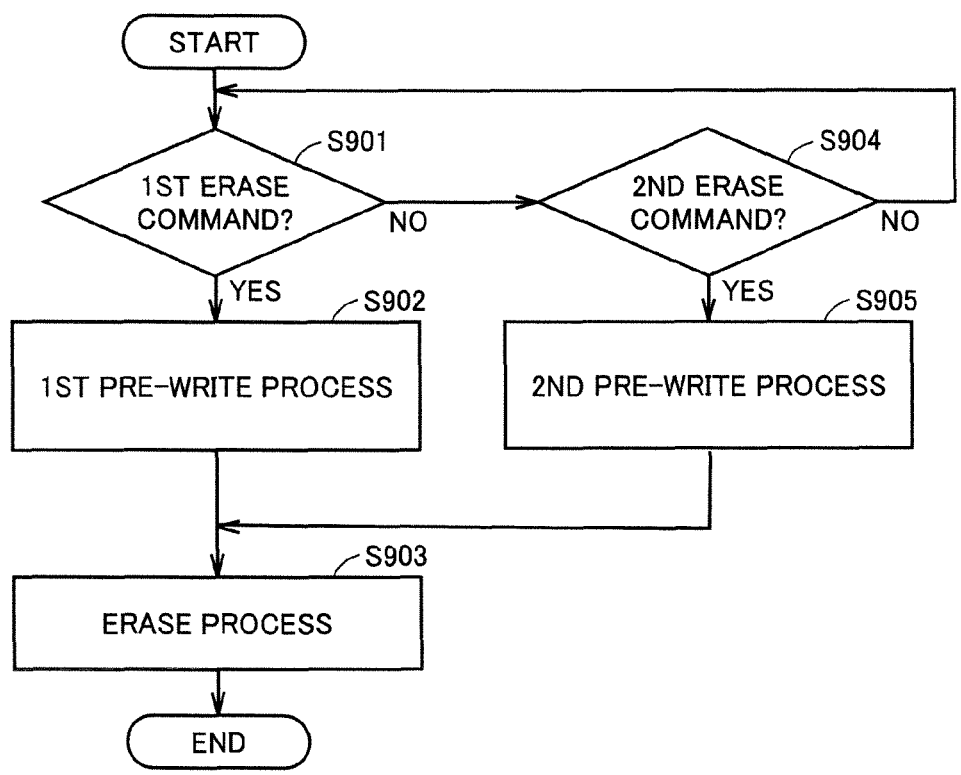
FIG. 2 is a flowchart of a procedure of an operation of the semiconductor device of the first embodiment.

FIG. 2 is a flowchart of a procedure of an operation of the semiconductor device of the first embodiment.

In Step S901, when control circuit 105 has externally received the first erase command, the process proceeds to Step S902.

In Step S904, when control circuit 105 has externally received the second erase command, the process proceeds to Step S905.

In Step S902, control circuit 105 controls performing the first pre-write process. In Step S905, control circuit 105 controls performing the second pre-write process.

After Step S902 and Step S905 are performed, the process proceeds to Step S903 and control circuit 105 controls performing the erase process.

Thus the present embodiment allows the first erase command to be used to allow a user to erase twin cell data to simply, additionally write data and the second erase command to be used to allow the user to erase twin cell data that the user desires to keep confidential.

Second Embodiment

Figure 3:
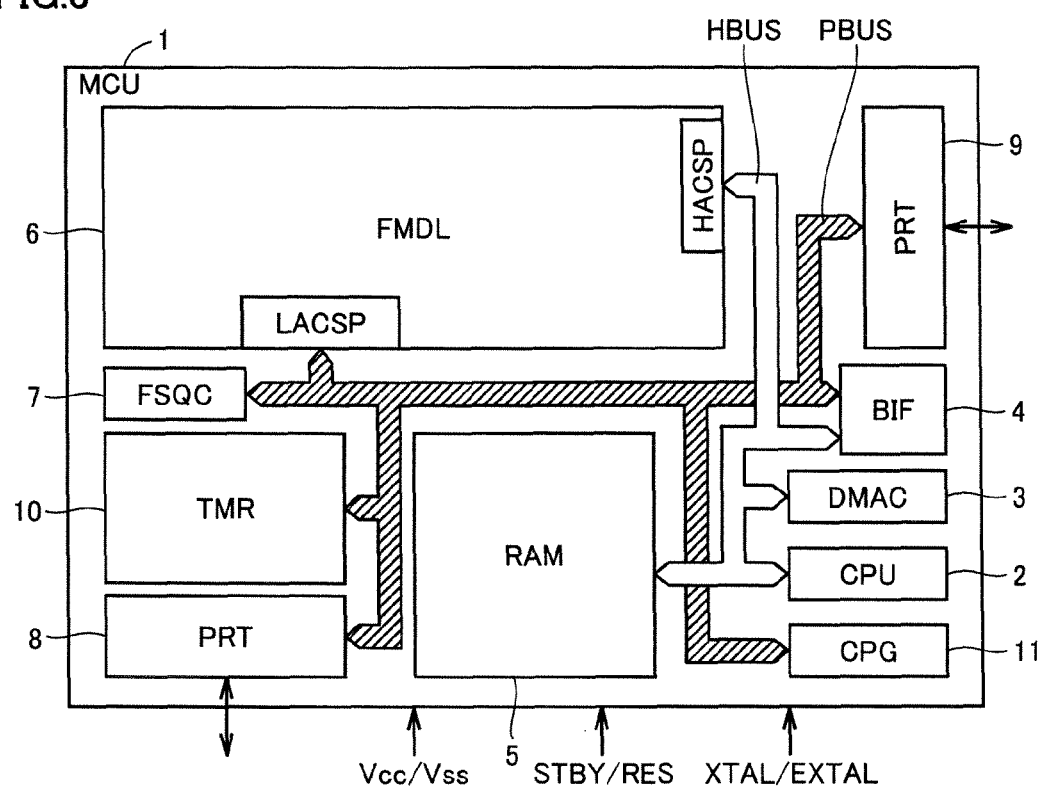
FIG. 3 shows a configuration of a microcomputer of a second embodiment.

FIG. 3 shows a configuration of a microcomputer 1 (a semiconductor device) of a second embodiment.

FIG. 3 shows microcomputer (MCU) 1 formed on a single chip of semiconductor such as monocrystalline silicon for example by complementary MOS IC fabrication technology.

Microcomputer 1 has a high-speed bus HBUS and a peripheral bus PBUS, although not limited as such. High-speed bus HBUS and peripheral bus PBUS each include a data bus, an address bus and a control bus, although not limited as such. The two buses can share a load otherwise imposed on a single common bus having all circuits connected thereto in common, and thus ensure a high-speed access operation.

To high-speed bus HBUS are connected: a central processing unit (CPU) 2 including an instruction control unit and an execution unit to execute an instruction; a direct memory access controller (DMAC) 3; and a bus interface circuit (BIF) 4 that controls interfacing or bridging high-speed bus HBUS and peripheral bus PBUS.

To high-speed bus HBUS are further connected: a random access memory (RAM) 5 used for a working area of central processing unit 2 and/or the like; and a flash memory module (FMDL) 6 serving as a nonvolatile memory module for storing data, a program and the like therein.

To peripheral bus PBUS are connected: a flash sequencer (FSQC) 7 that controls a command access to flash memory module (FMDL) 6; external input/output ports (PRT) 8 and 9; a timer (TMR) 10; and a clock pulse generator (CPG) 11 that generates an internal clock CLK for controlling microcomputer 1.

Furthermore, microcomputer 1 includes: a clock terminal having XTAL/EXTAL to allow an oscillator to be connected thereto, or receiving an external clock; an external hardware standby terminal STBY for indicating a standby state; an external reset terminal RES for indicating resetting; an external power supply terminal Vcc; and an external ground terminal Vss.

Herein, flash sequencer 7, serving as a logic circuit, and flash memory module 6, having an array structure, are designed using a CAD tool, and accordingly, they are shown as discrete circuit blocks in the drawing for the sake of convenience, however, they together constitute a single flash memory. Flash memory module 6 is connected to high-speed bus HBUS through a high-speed access port (HACSP) dedicated to reading. CPU 2 or and DMAC 3 can access flash memory module 6 on high-speed bus HBUS through the high-speed access port to read therefrom. When accessing flash memory module 6 to write thereto and initialize it, CPU 2 or DMAC 3 issues a command to flash sequencer 7 on peripheral bus PBUS via bus interface 4. Flash sequencer 7 thus controls initialization of and an operation to write to flash memory module 6 via peripheral bus PBUS and through a low-speed access port (LACSP).

Flash Memory Module

Figure 4:
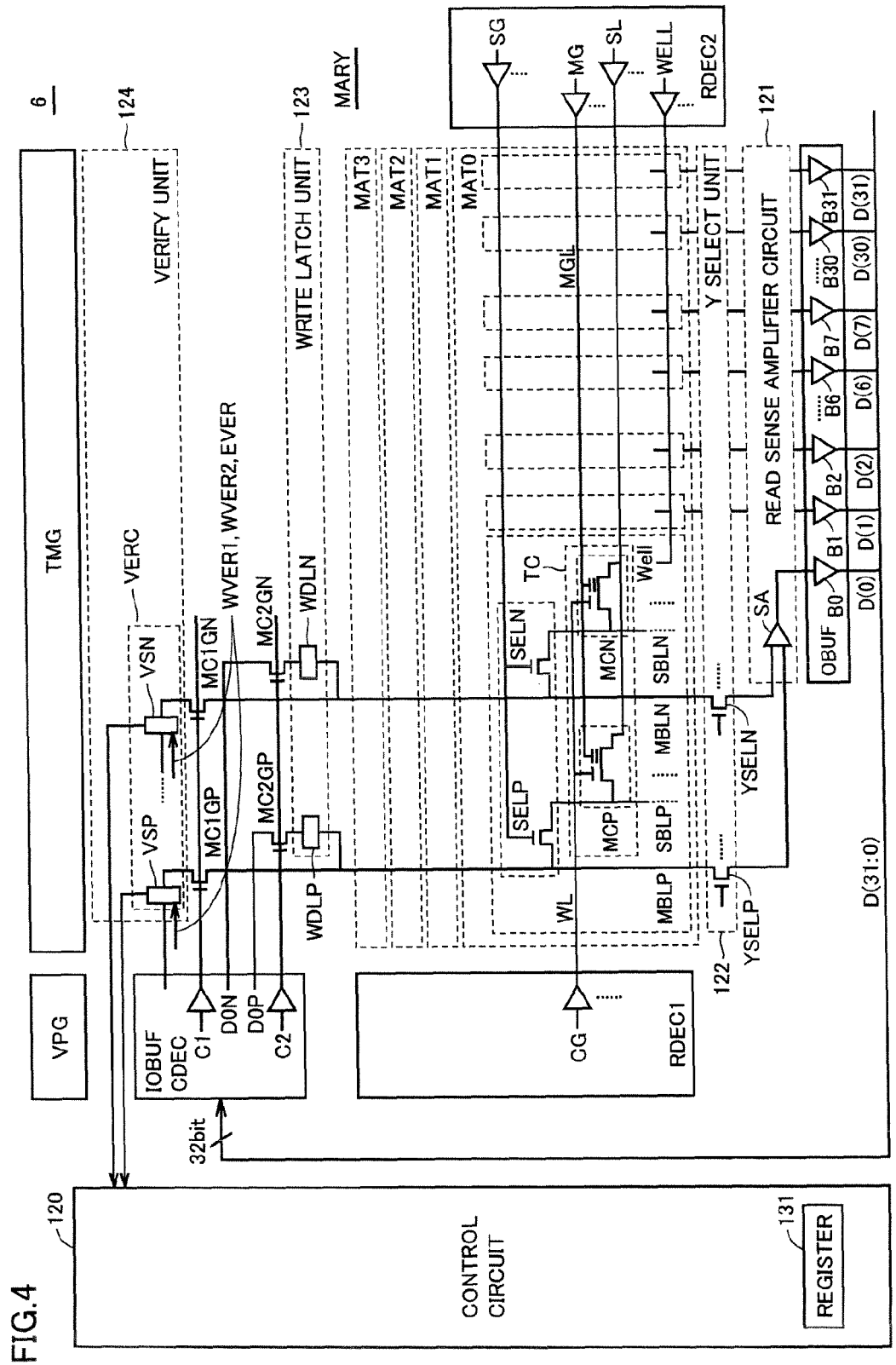
FIG. 4 shows a configuration of a flash memory module.

FIG. 4 shows a configuration of flash memory module 6.

Flash memory module 6 uses two nonvolatile memory cells to store one bit of information. More specifically, a memory array MARY includes a plurality of 1-bit twin cells TCs each composed of two rewritable, nonvolatile memory cells MCP and MCN. FIG. 4 shows only one pair representatively. In the present specification, memory cell MCP is referred to as a positive cell, and memory cell MCN is referred to as a negative cell. Memory array MARY is divided into four memory mats MAT0-MAT3. Each memory mat MAT has a size of 8 K bytes for the sake of illustration.

Nonvolatile memory cell MCP, MCN is for example a split gate type flash memory device shown in FIG. 5(a) by way of example. The memory device has a control gate CG and a memory gate MG disposed on a channel region between source and drain regions with a gate isolation film interposed therebetween. A charge trap region (SiN) of silicon nitride or the like is disposed between memory gate MG and the gate isolation film. A source or drain region associated with a select gate is connected to a bit line BL (SBLP or SBLN), and a source or drain region associated with the memory gate is connected to a source line SL.

To decrease the memory cell's threshold voltage Vth, BL=1.5 V, CG=0 V, MG=−10 V, SL=6, and WELL=0 V are applied and a high electric field between a well region (WELL) and memory gate MG allows electrons to be drawn from the charge trap region (SiN) to the well region (WELL). This process is done such that a plurality of memory cells sharing memory gate MG serve as a unit.

To increase the memory cell's threshold voltage Vth, BL=0 V, CG=0.9 V, MG=10 V, SL=6, and WELL=0 V are applied and a write current is passed from source line SL to the bit line, and hot electrons generated at a boundary of control gate CG and memory gate MG are thus injected into the charge trap region (SiN). As the injection of electrons depends on whether or not to pass a current on a bit line, this process is controlled in bits.

A read is performed with BL=1.5 V, CG=1.5 V, MG=0 V, SL=0 V, and WELL=0 V applied. When the memory cell has low threshold voltage Vth, the memory cell is turned on, whereas when the memory cell has high threshold voltage Vth, the memory cell is turned off.

The memory device is not limited to the split gate type flash memory device, and it may be a stacked gate type flash memory device shown in FIGS. 5(b) and 5(c) by way of example. This type of memory device has a floating gate FG and a control gate WL stacked on a channel region between source and drain regions with a gate isolation film interposed. In FIG. 5(b), a hot carrier writing system is employed to increase threshold voltage Vth, and discharging electrons to well region WELL decreases threshold voltage Vth. In FIG. 5(c), an FN tunnel writing system is employed to increase threshold voltage Vth, and discharging electrons to bit line BL decreases threshold voltage Vth.

Memory gate MG, control gate CG, source line SL, WELL, bit line BL receive voltage, as described above, which is generated in a power supply circuit VPG and supplied, as controlled by flash sequencer 7.

In the following description, the memory device will be described as the split gate type flash memory device.

Storing information by a single twin cell TC composed of nonvolatile memory cells MCP and MCN is done by storing complementary data to nonvolatile memory cells MCP and MCN.

More specifically, memory cells MCP, MCN can each hold cell data of "1" (a low threshold voltage state: a state with a threshold voltage smaller than an erase verify level) or cell data of "0" (a high threshold voltage state: a state with the threshold voltage equal to or larger than the erase verify level).

Figure 6:
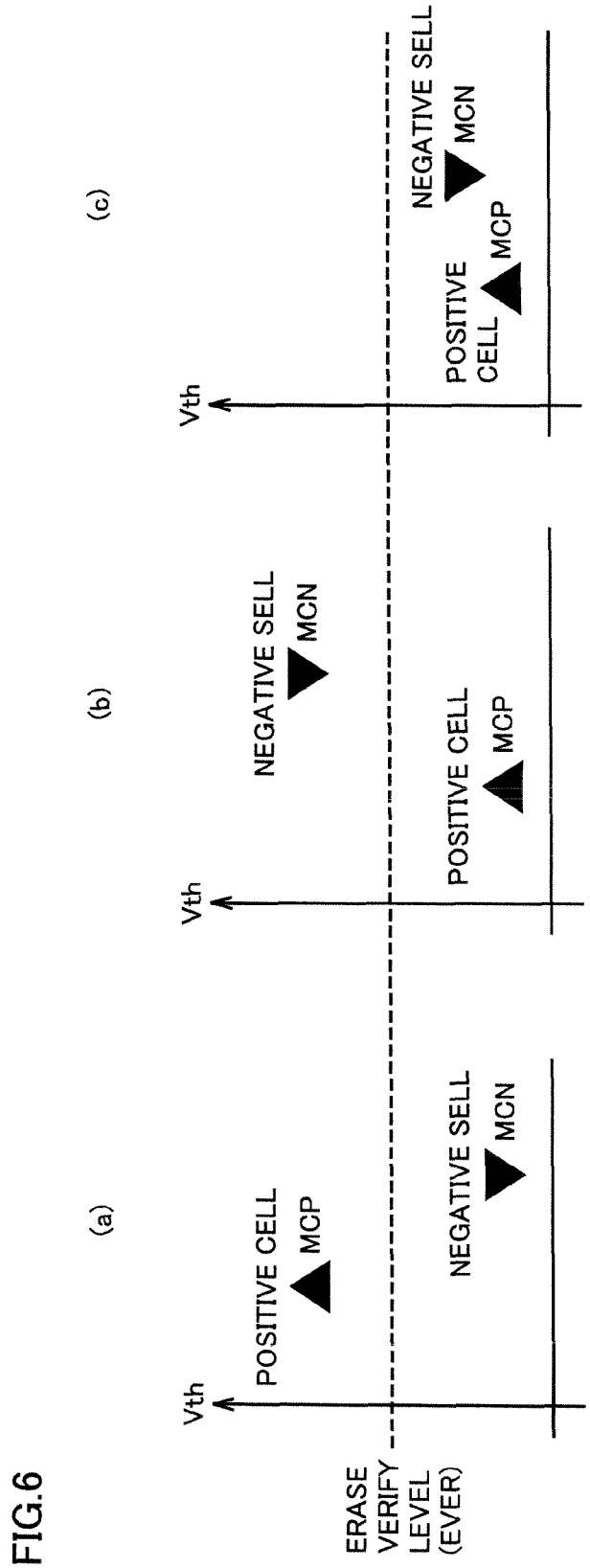
FIG. 6($a$) shows a state with twin cell data having "0" stored therein.

As shown in FIG. 6(a), twin cell data of "0" is a state with positive cell MCP holding cell data of "0" and negative cell MCN holding cell data of "1". As shown in FIG. 6(b), twin cell data of "1" is a state with positive cell MCP holding cell data of "1" and negative cell MCN holding cell data of "0".

As shown in FIG. 6(c), a state of a twin cell with positive and negative cells MCP and MCN both holding cell data of "1" is an initialized state. The initialized state is also referred to as a blank erase state.

A state with twin cell data of "0" cannot directly transition to a state with twin cell data of "1" and vice versa, and they must transition to each other via the blank erase state as an intermediate state.

Bring the state with twin cell data of "0" and the state with twin cell data of "1" to the initialized state is referred to as erasing twin cell data. The erase operation collectively erases a block to be erased, and accordingly, positive cell MCP and negative cell MCN will both hold cell data of "1". Furthermore, bring the initialized state to a state with twin cell data of "1" held or a state with twin cell data of "0" held is referred to as normally writing twin cell data. Memory cells MCP and MCN of the twin cell representatively shown in FIG. 4 have memory gate MG connected to a common memory gate select line MGL and have control gate CG connected to a common word line WL. Memory cell MCP, MCN has a source connected to a common source line SL. In reality, a large number of twin cells are arranged in a matrix, and they are connected for each row to memory gate select line MGL and word line WL associated therewith.

Memory cells MCP, MCN have drain terminals connected for each column to sub bit lines SBLP, SPLN, respectively, and connected via sub bit line selectors SELP, SELN to main bit lines MBLP, MBLN, respectively. Each main bit line MBLP and each main bit line MBLN have a plurality of sub bit lines SBLP and a plurality of sub bit lines SBLN connected thereto such that they are hierachicalized by sub bit line selectors SELP and SELN, respectively.

Word line WL is selected by a first row decoder RDEC. Memory gate select line MGL and sub bit line selectors SELP, SELN are selected by a second row decoder RDEC2. First and second row decoders 24 and 25 perform a select operation for a read access in accordance with address information and the like supplied to the HACSP, whereas the row decoders perform a select operation for a data write operation and an initialization operation in accordance with address information and the like supplied to the LACSP.

Power supply circuit VPG generates various operating voltages required for reading, writing, and initialization. Timing generator TMG follows an access strobe signal supplied from CPU 2 or the like to the HACSP, an access command supplied from FSQC 7 to the LACSP, and the like to generate an internal control signal to define how to time an internal operation.

Sub bit line selectors SELP and SELN are turned on/off by an SG signal and enabled when a read/a write/an erase is performed. Main bit lines MBLP and MBLN are connected to a read sense amplifier SA that is included in a read sense amplifier circuit 121 via Y selectors YSELP and YSELN that are included in a Y select unit 122.

Y selectors YSELP and YSELN select main bit lines MBLP and MBLN to be connected in accordance with a result decoded by an address in a read/write. Read sense amplifier SA reads twin cell data from a difference in threshold voltage Vth between positive and negative cells MCP and MCN coupled with main bit lines MBLP and MBLN selected.

In the FIG. 4 example, 32 sense amplifiers SA are disposed, and data of 8 bits with one address assigned thereto serves as memory data for the sake of illustration. Thus, a single access allows data of 4 addresses to be read in parallel.

Read sense amplifier SA reads memory data which is in turn output by an output buffer OBUF to a data bus D(31:0). Data bus D(31:0) receives the data, which is in turn output to an input/output circuit IOBUF. Output buffer OBUF includes buffers B0-B31 receiving an output from each read sense amplifier SA.

Input/output circuit IOBUF externally outputs data read by read sense amplifier SA, and processes write data received from outside flash memory module 6 in a write.

A column decoder CDEC, in a write, turns on rewrite column selectors MC2GP and MC2GN by a C2 signal, input/output circuit IOBUF sets data to a positive write data latch circuit WDLP and a negative write data latch circuit WDLN via signal lines D0P and D0N. Column decoder CDEC provides a select operation in accordance with address information supplied to the LACSP or the like.

When data of "0" is written to twin cell TC, data of "0" is set to positive write data latch circuit WDLP and data of "1" is set to negative write data latch circuit WDLN. A current flows to positive cell MCP coupled with positive write data latch circuit WDLP having data of "0" set thereto, and positive cell MCP's threshold voltage Vth increases. In contrast, no current flows to memory cell MCN coupled with negative write data latch circuit WDLN having data of "1" set thereto, and negative cell MCN's threshold voltage Vth does not increase.

When data of "1" is written to twin cell TC, data of "1" is set to positive write data latch circuit WDLP included in a write latch unit 123 and data of "0" is set to negative write data latch circuit WDLN included in write latch unit 123. A current flows to negative cell MCN coupled with negative write data latch circuit WDLN having data of "0" set thereto, and negative cell MCN's threshold voltage Vth increases. In contrast, no current flows to memory cell MCP coupled with positive write data latch circuit WDLP having data of "1" set thereto, and positive cell MCP's threshold voltage Vth does not increase.

Twin cell data is erased with an 8 K byte memory mat serving as a unit, and an erase voltage is applied to the memory mat's twin cells TCs. The erase voltage is applied to SG, MG, SL, WELL, as controlled by a control circuit 120.

Main bit lines MBLP and MBLN are connected to a verify unit 124 at a verify circuit VERC via verify selectors MC1GP and MC1GN, respectively, controlled by a C1 signal.

Verify circuit VERC determines whether a memory cell has threshold voltage Vth exceeding a defined value when it has memory erased therefrom or a write is done thereto. The result of the verification is output to control circuit 120, and whether repetitively applying a pulse is required is determined in control circuit 120. For the write, the verification can be done, or whether the memory cell has a threshold voltage exceeding the defined value can be determined, with reference to either one of a first write verify voltage WVER1 or a second write verify voltage WVER2. First write verify voltage WVER1 and second write verify voltage WVER2 have a relationship of WVER1<WVER2.

Verify circuit VERC includes a positive verify sense amplifier VSP and a negative verify sense amplifier VSN.

Positive verify sense amplifier VSP compares main bit line MBLP's voltage with a reference voltage in magnitude. The reference voltage that is supplied for a normal write is first write verify voltage WVER1, the reference voltage that is supplied in a block erase 2 for the second pre-write process is second write verify voltage WVER2, and the reference voltage that is supplied for an erase is an erase verify voltage EVER.

Negative verify sense amplifier VSN compares main bit line MBLN's voltage with a reference voltage. The reference voltage that is supplied for a normal write is first write verify voltage WVER1, the reference voltage that is supplied in block erase 2 for the second pre-write process is second write verify voltage WVER2, and the reference voltage that is supplied for an erase is erase verify voltage EVER.

Write Latch Circuit

Figure 7:
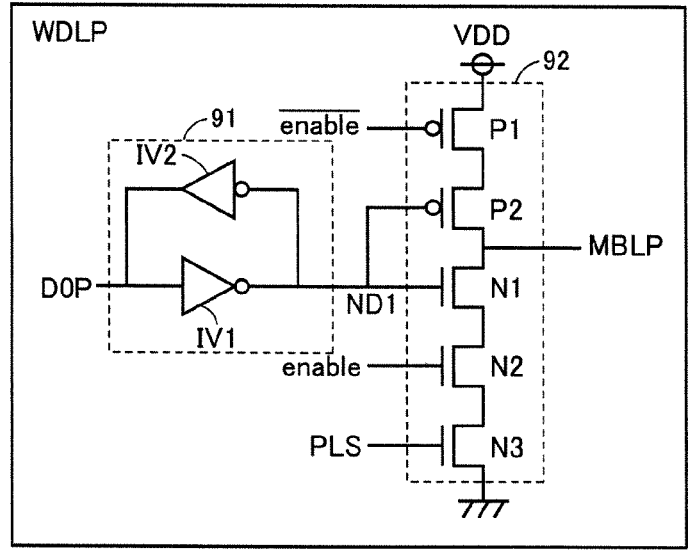
FIG. 7 shows a configuration of a positive write data latch circuit.

FIG. 7 shows a configuration of positive write data latch circuit WDLP.

Positive write data latch circuit WDLP includes a data holding unit 91 and a setting unit 92.

Data holding unit 91 includes alternately connected inverters IV1 and IV2.

Inverter IV1 and inverter IV2 have an input and an output, respectively, connected to signal line D0P connected to input/output circuit IOBUF. Inverter IV1 and inverter IV2 have an output and an input, respectively, connected to a node ND1.

Setting unit 92 includes p channel MOS transistors P1, P2 and n channel MOS transistors N1, N2, N3 between a power supply voltage VDD and a ground voltage Vss.

P channel MOS transistor P1 has a gate receiving an inverted version of a programming pulse enable signal denoted as /enable. P channel MOS transistor P2 and n channel MOS transistor N1 have their respective gates connected to node ND1. N channel MOS transistor N2 has a gate receiving a programming pulse enable signal denoted as enable. N channel MOS transistor N3 has a gate receiving a pulse PLS.

When input/output circuit IOBUF transmits data of "1" on signal line D0P, node ND1 has data, i.e., latched write data, going low, and main bit line MBLP attains a voltage of VDD.

When input/output circuit IOBUF transmits data of "0" on signal line D0P, node ND1 has data, i.e., latched write data, going high, and while a write pulse WPLS is active, main bit line MBLP connects to ground voltage Vss, and a write current flows through main bit line MBLP.

Figure 8:
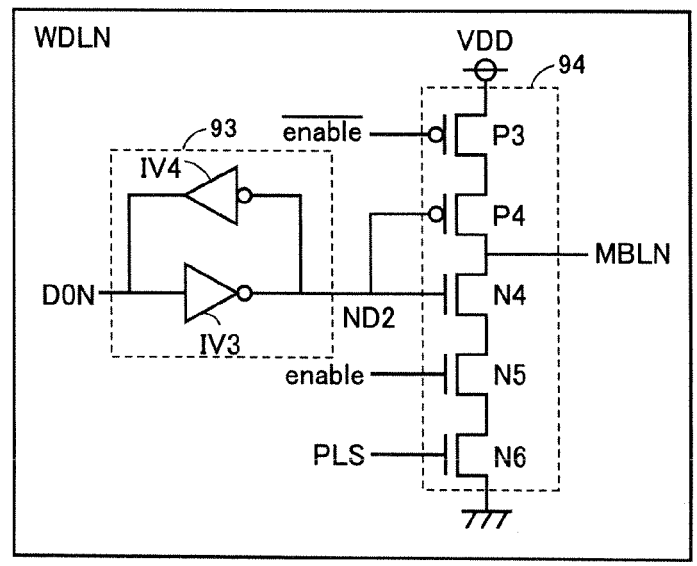
FIG. 8 shows a configuration of a negative write data latch circuit.

FIG. 8 shows a configuration of negative write data latch circuit WDLN.

Negative write data latch circuit WDLN includes a data holding unit 93 and a setting unit 94.

Data holding unit 93 includes alternately connected inverters IV3 and IV4.

Inverter IV3 and inverter IV4 have an input and an output, respectively, connected to signal line D0N connected to input/output circuit IOBUF. Inverter IV3 and inverter IV4 have an output and an input, respectively, connected to a node ND2.

Setting unit 94 includes p channel MOS transistors P3, P4 and n channel MOS transistors N4, N5, N6 between power supply voltage VDD and ground voltage Vss.

P channel MOS transistor P3 has a gate receiving the inverted version of the programming pulse enable signal denoted as /enable. P channel MOS transistor P4 and n channel MOS transistor N4 have their respective gates connected to node ND2. N channel MOS transistor N5 has a gate receiving the programming pulse enable signal denoted as enable. N channel MOS transistor N6 has a gate receiving pulse PLS.

When input/output circuit IOBUF transmits data of "1" on signal line D0N, node ND2 has data, i.e., latched write data, going low, and main bit line MBLN attains a voltage of VDD.

When input/output circuit IOBUF transmits data of "0" on signal line D0N, node ND2 has data, i.e., latched write data, going high, and while write pulse WPLS is active, main bit line MBLN connects to ground voltage Vss, and a write current flows through main bit line MBLN.

Programming Twin Cell Data (or Normal Writing)

Figure 9:
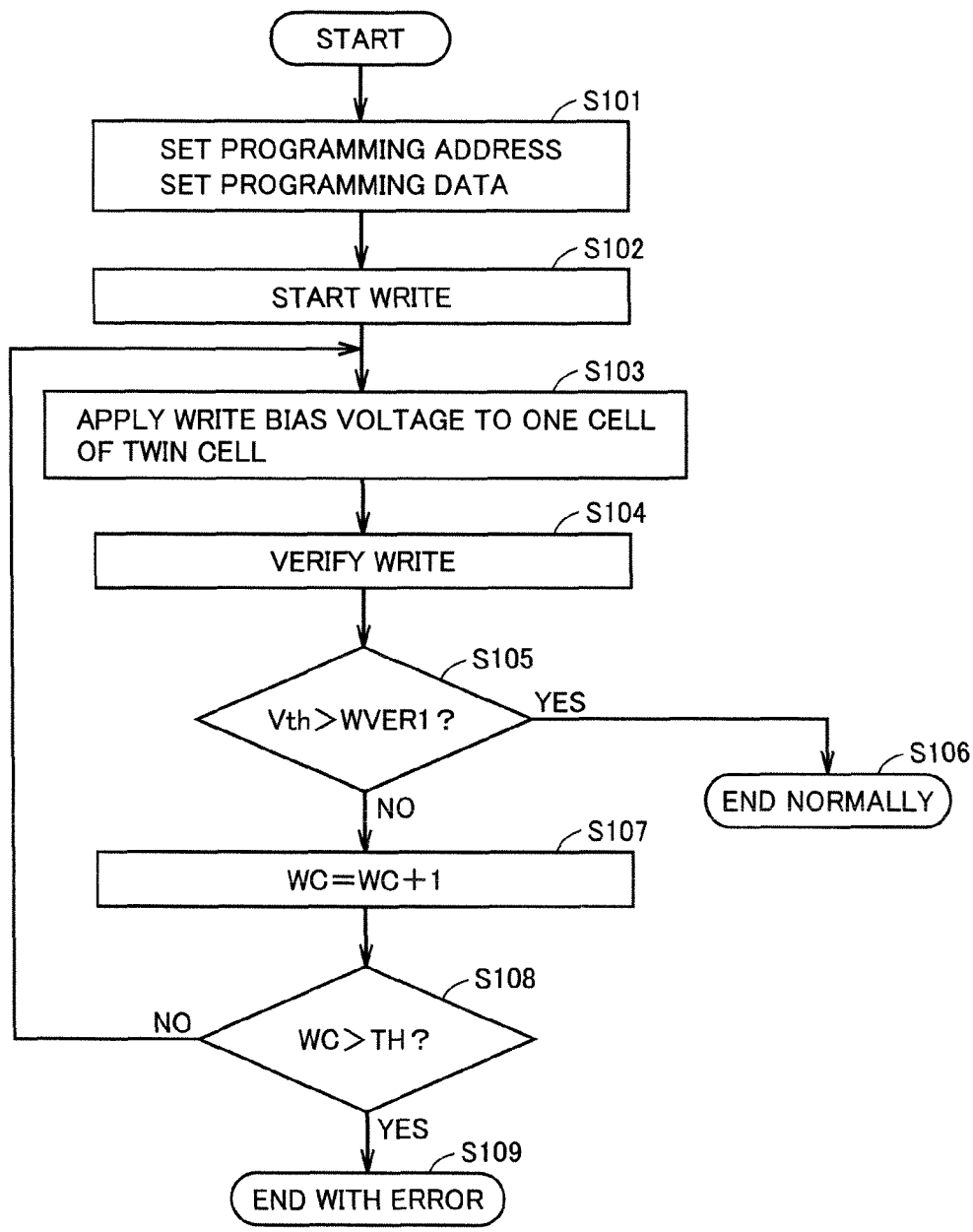
FIG. 9 is a flowchart of a procedure of programming twin cell data according to the second embodiment.
Figure 10:
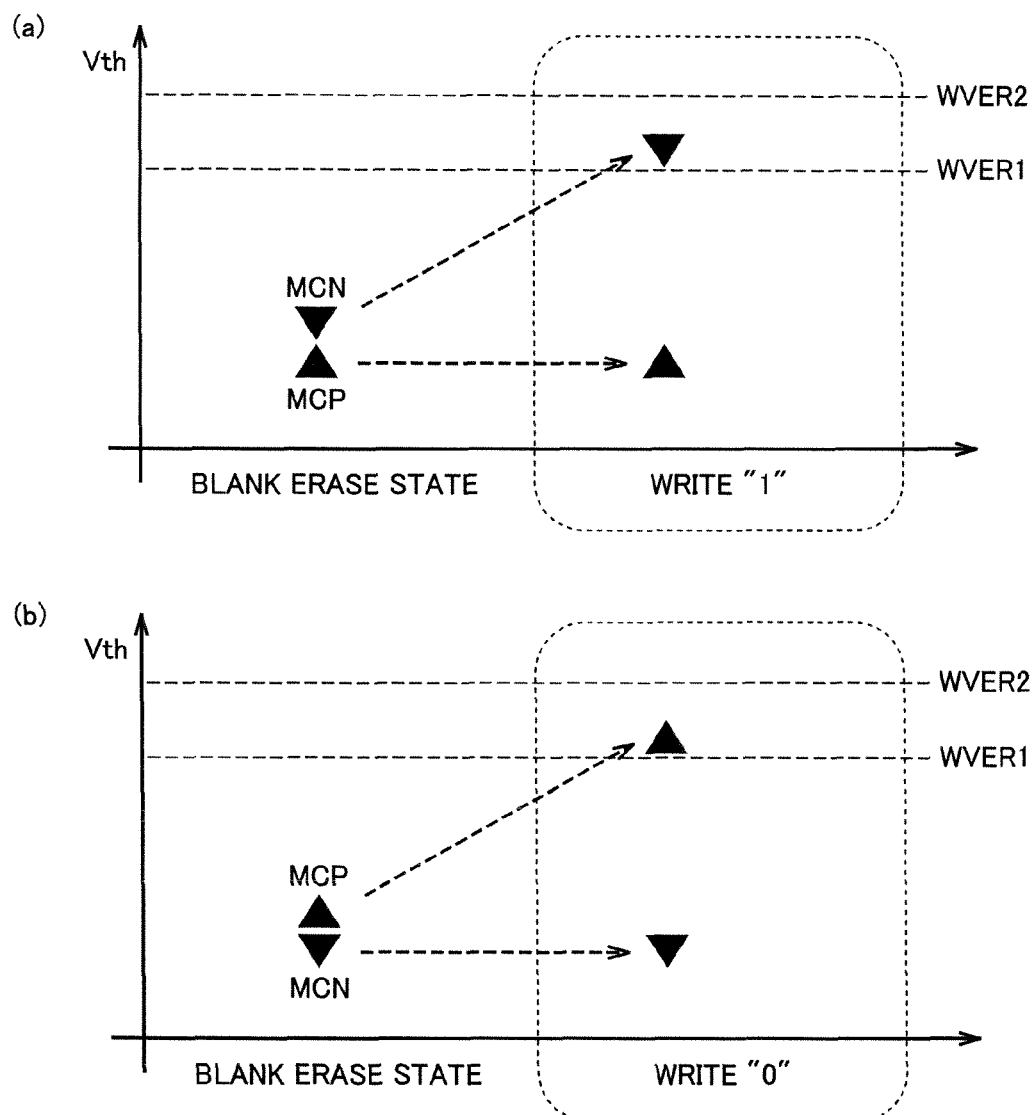
FIG. 10($a$) shows how a threshold voltage varies in a write for programming data of "1".

FIG. 9 is a flowchart of a procedure of programming twin cell data, also referred to as normal writing, according to the second embodiment. FIG. 10(a) shows how threshold voltage Vth varies in a write for programming data of "1". FIG. 10(b) shows how threshold voltage Vth varies in a write for programming data of "0".

In Step S101, a programming command, a programming address, and programming data are output from CPU 2 and input to flash memory module 6. In accordance with the input programming address, first row decoder RDEC1, second row decoder RDEC2, and column decoder CDEC select twin cell TC. Column decoder CDEC turns on rewrite column selectors MC2GP and MC2GN by the C2 signal, and input/output circuit IOBUF sets data to positive write data latch circuit WDLP and negative write data latch circuit WDLN via signal lines D0P and D0N in accordance with the programming data input.

In Step S102, control circuit 120 starts a write.

In Step S103, control circuit 120 sets MG, CG, and SL each to a write bias voltage (a voltage applied to increase Vth) shown in FIG. 5(a), and applies the write bias voltage to the selected twin cell TC at one memory cell to allow the selected twin cell TC to have one memory cell with threshold voltage Vth increased.

In Step S105, the write is verified. More specifically, for the programming data of "0", positive verify sense amplifier VSP determines whether positive cell MCP has threshold voltage Vth exceeding first write verify voltage WVER1 shown in FIG. 10(a) and FIG. 10(b). For the programming data of "1", negative verify sense amplifier VSN determines whether negative cell MCN has threshold voltage Vth exceeding first write verify voltage WVER1 shown in FIG. 10(a) and FIG. 10(b).

In Step S105, when threshold voltage Vth is equal to or lower than first write verify voltage WVER1, the process proceeds to Step S107, whereas when threshold voltage Vth exceeds first write verify voltage WVER1, the process normally ends (Step S106).

In Step S107, control circuit 120 increments a write count WC by one.

In Step S108, when write count WC is equal to or smaller than a threshold value TH, the process returns to Step S103, whereas when write count WC exceeds threshold value TH, the process ends with an error (Step S109).

Block Erase 1 of Twin Cell Data

Figure 11:
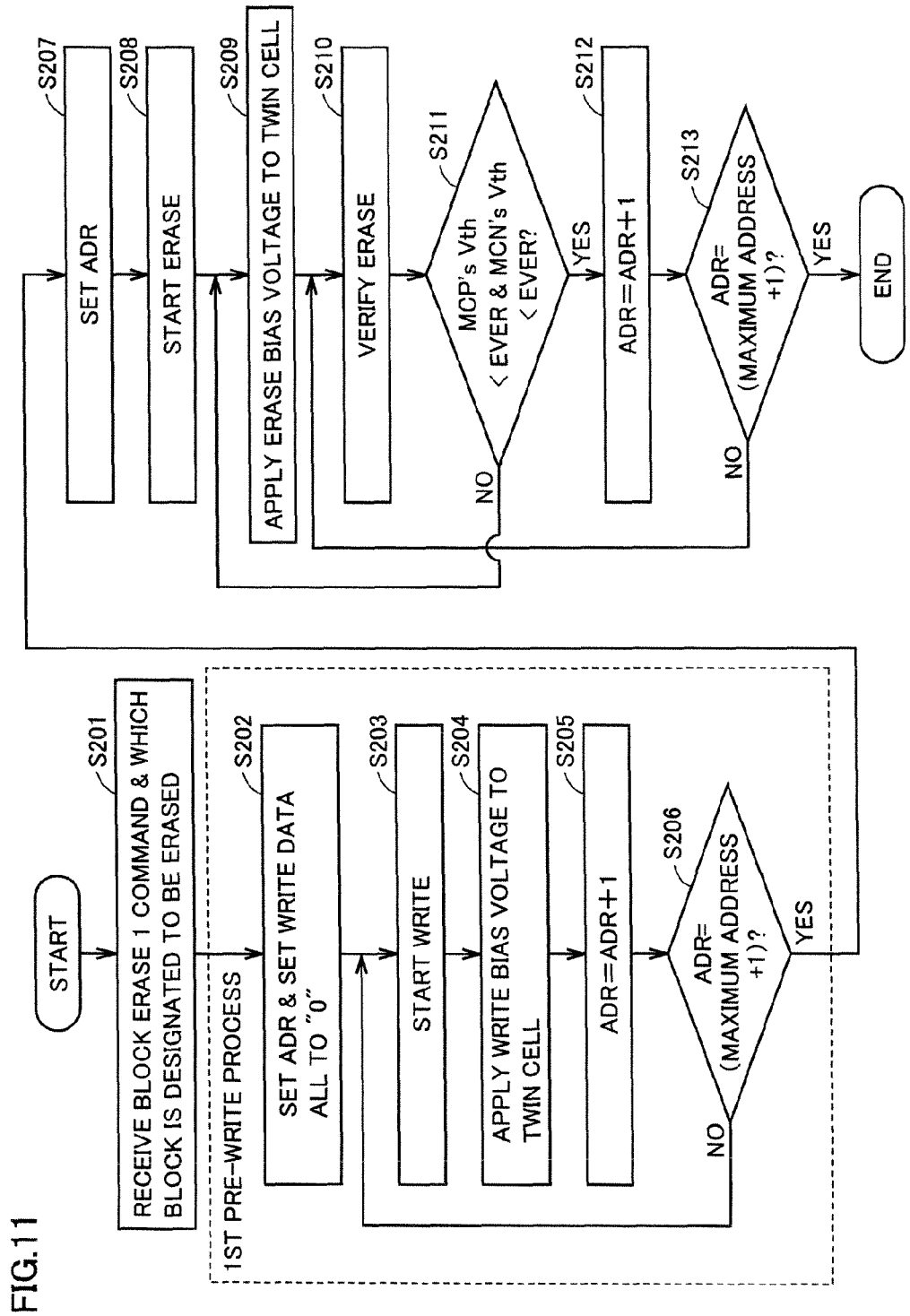
FIG. 11 is a flowchart of a procedure of a block erase 1 of twin cell data according to the second embodiment.
Figure 12:
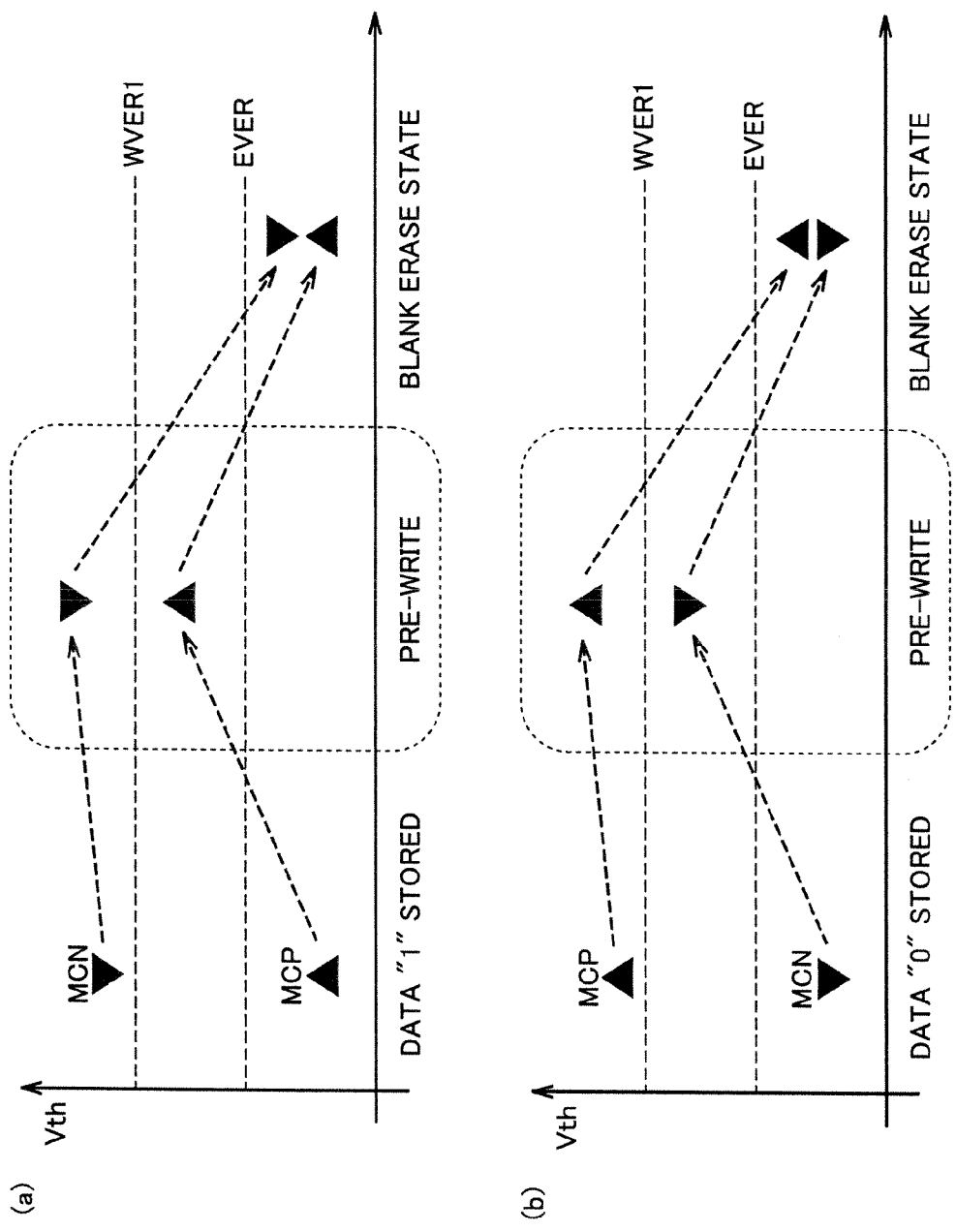
FIG. 12($a$) shows how a threshold voltage varies when block erase 1 starts from a state with data of "1" stored.

FIG. 11 is a flowchart of a procedure of a block erase 1 of twin cell data (an erase in a first erase mode) according to the second embodiment. FIG. 12(a) shows how threshold voltage Vth varies when block erase 1 starts from a state with data of "1" stored. FIG. 12(b) shows how threshold voltage Vth varies when block erase 1 starts from a state with data of "0" stored.

In Step S201, a block erase 1 command and which block is designated to be erased are output from CPU 2 and input to flash memory module 6. The block designated to be erased is any of memory mats MAT0-MAT3.

In Steps S202-S206, positive cell MCP and negative cell MCN have their respective data both once set to "0", i.e., the first pre-write process is performed. The first pre-write process applies a write bias voltage smaller than that applied in a normal write (i.e., the voltage applied to increase Vth as shown in FIG. 5(a)) to cause both positive cell MCP and negative cell MCN to undergo a stress smaller than that imposed by the normal write. In the first pre-write process, a memory cell having a smaller threshold voltage has the threshold voltage increased in an amount smaller than an amount in which threshold voltage Vth is increased in the normal write. The first pre-write is provided in order to reduce variation in erase stress between positive cell MCP and negative cell MCN to minimize impaired retention. More specifically, this is done because when a memory cell in a state with low threshold voltage Vth is erased, threshold voltage Vth will further be lowered, and the memory cell in the state with low threshold voltage Vth experiences intense stress and is thus impaired in reliability. Note, however, that the first pre-write process does not perform a write to a memory cell to allow the memory cell to have threshold voltage Vth higher than first write verify voltage WVER1, as done in the normal write; rather, the process only allows threshold voltage Vth to be high to some extent. Accordingly, reading and verifying write data, as done in the normal write, is avoided. This is done in order to reduce a time required for block erase 1.

In Step S202, control circuit 120 sets an initial value of an address ADR to a leading address of a block to be erased. Address ADR is a form of address to specify a 32-bit boundary to access 32 bits of data. More specifically, address ADR is an address assigned for every eight bits with the two least significant bits deleted to have the third less significant bit as the least significant bit. In accordance with address ADR, first row decoder RDEC1, second row decoder RDEC2, and column decoder CDEC select 32 twin cells TCs designated by the leading address. Furthermore, input/output circuit IOBUF sets write data all to "0". More specifically, column decoder CDEC turns on rewrite column selectors MC2GP and MC2GN by the C2 signal, and input/output circuit IOBUF sets "0" to any positive and negative write data latch circuits WDLP and WDLN that are connected to twin cells TCs of the block to be erased via signal lines D0P and D0N.

In Step S203, control circuit 120 starts a write.

In Step S204, control circuit 120 applies a write bias voltage smaller than that applied in a normal write to the selected twin cells TCs through MG, CG and SL to allow the twin cells TCs to have memory cells MCP and MCN both with threshold voltage Vth increased.

In Step S205, control circuit 120 increments address ADR by one.

In Step S206, when address ADR is (a maximum address +1), the first pre-write ends, and the process proceeds to Step S207. When address ADR is not (the maximum address +1), the process returns to Step S203. The maximum address corresponds to an address that indicates the last 32-bit area of the block to be erased.

In Steps S207-S213, an erase process is performed.

In Step S207, control circuit 120 sets the initial value of address ADR to the leading address of the block to be erased. In accordance with address ADR, first row decoder RDEC1, second row decoder RDEC2, and column decoder CDEC select twin cell TC.

In Step S208, control circuit 120 starts an erase.

In Step S209, control circuit 120 sets MG, CG, and SL to an erase bias voltage (a voltage applied to decrease Vth)

shown in FIG. 5(a), and applies the erase bias voltage to the selected 32 twin cells TCs to allow the twin cells to have memory cells MCP and MCN both with threshold voltage Vth decreased.

In Step S210, the erase is verified. More specifically, positive verify sense amplifier VSP determines whether positive cell MCP has threshold voltage Vth below erase verify voltage EVER shown in FIG. 12(a) and FIG. 12(b). Negative verify sense amplifier VSN determines whether negative cell MCN has threshold voltage Vth below erase verify voltage EVER shown in FIG. 12(a) and FIG. 12(b).

In Step S211, when at least one of cells MCP and MCN has threshold voltage Vth equal to or higher than erase verify voltage EVER, the process returns to Step S209, whereas when cells MCP and MCN both have threshold voltage Vth lower than erase verify voltage EVER, the process proceeds to Step S212.

In Step S212, control circuit 120 increments address ADR by one.

In step S213, when address ADR is (the maximum address +1), the erase ends, and the process ends. When address ADR is not (the maximum address +1), the process returns to Step S210.

Thus, as shown in FIG. 12(a) and FIG. 12(b), when block erase 1 ends, positive cell MCP and negative cell MCN have threshold voltage Vth maintained in a relationship in magnitude that the cells had had threshold voltage Vth in before the block erase was performed. When a read is performed with this relationship maintained, positive cell MCP and negative cell MCN has a difference in threshold voltage Vth, and twin cell data will be read as before block erase 1 is performed. However, this does not matter if block erase 1 is performed for the purpose of ensuring a memory area for a subsequent write, and it is also advantageous that it is performed in a shorter period of time than a block erase 2 command described hereinafter.

Block Erase 2 of Twin Cell Data

Figure 13:
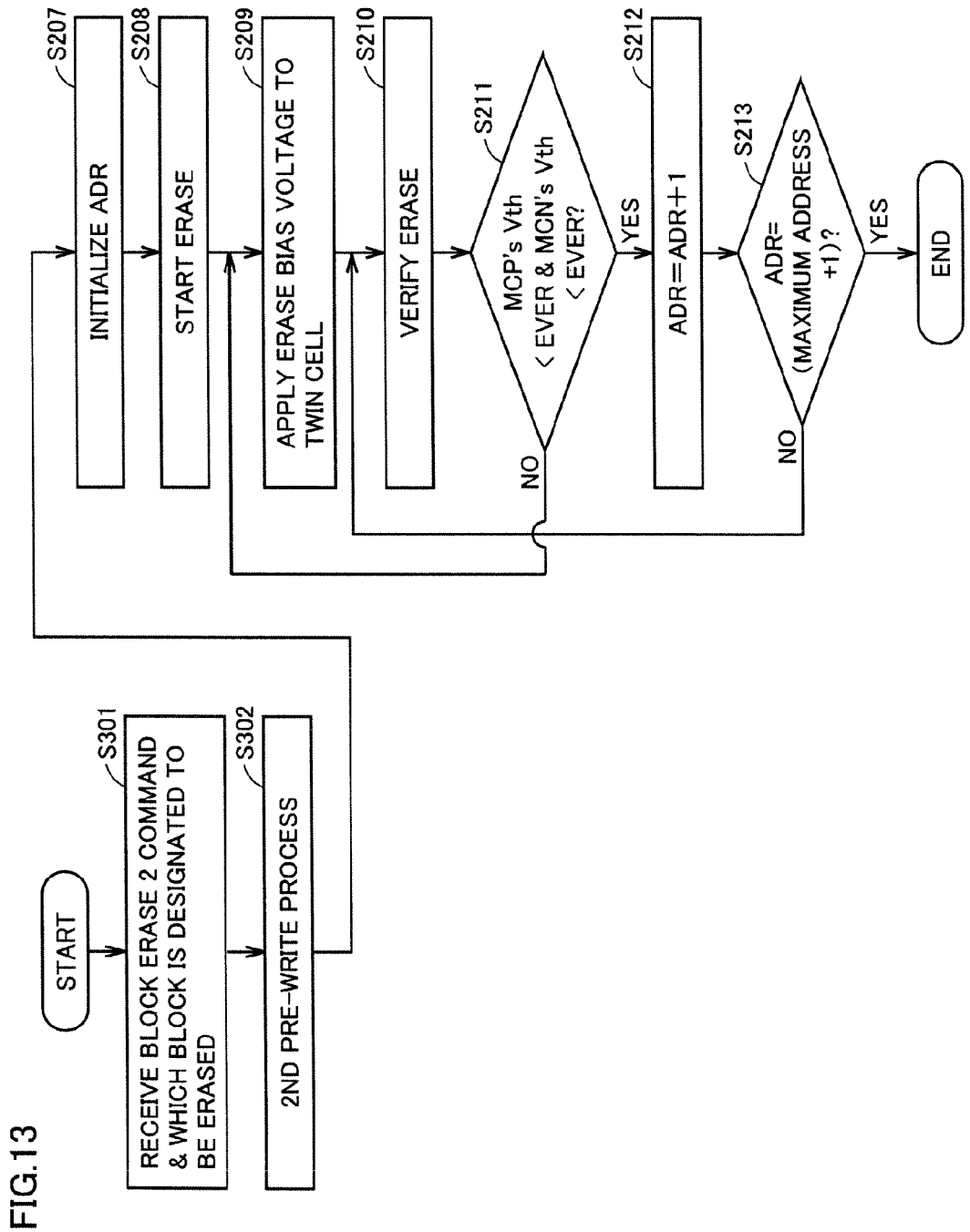
FIG. 13 is a flowchart of a procedure of a block erase 2 of twin cell data according to the second embodiment.
Figure 14:
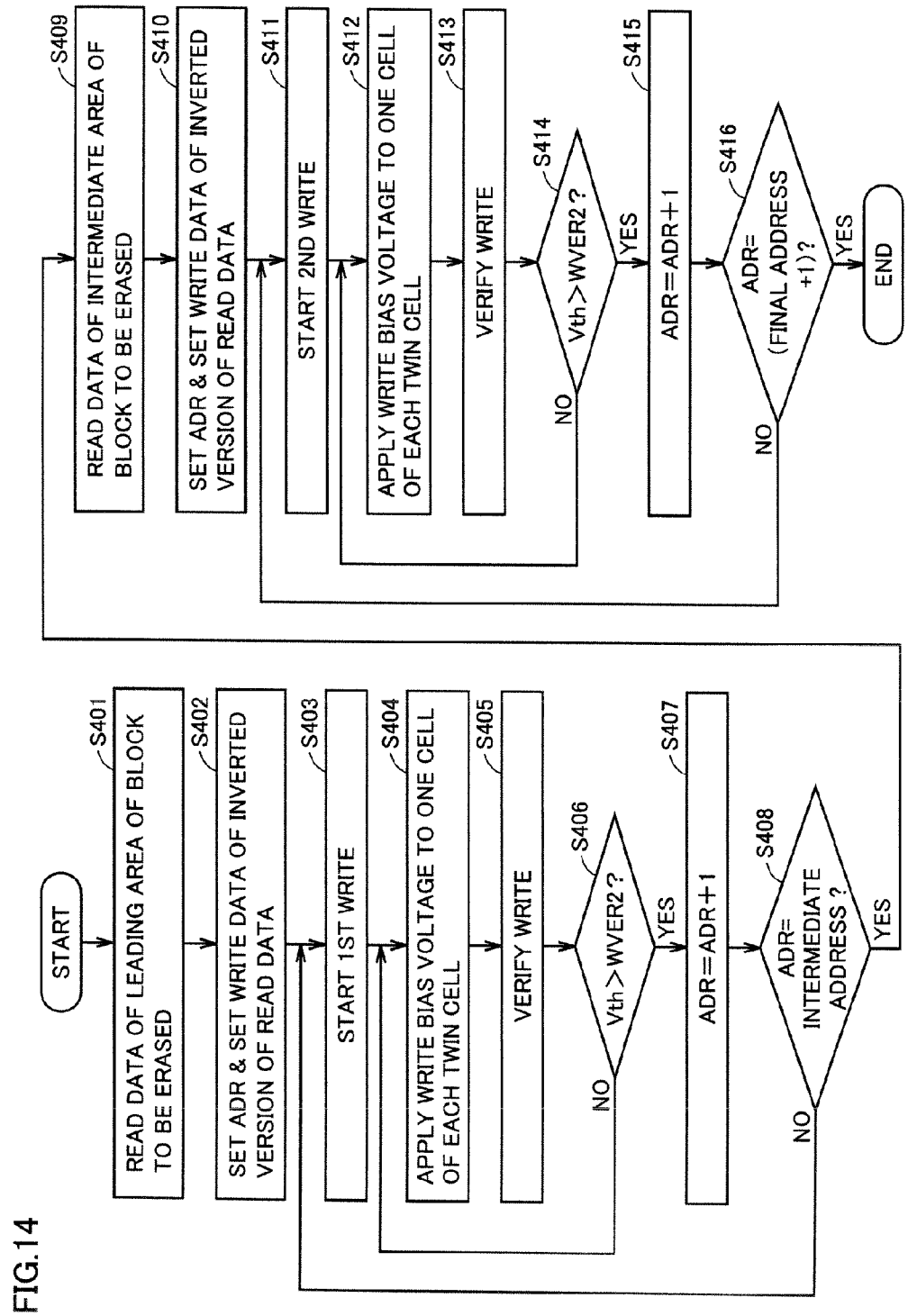
FIG. 14 is a flowchart of a procedure of a second pre-write process.

FIG. 13 is a flowchart of a procedure of block erase 2 of twin cell data (an erase in a second erase mode) according to the second embodiment. FIG. 14 is a flowchart of a procedure of the second pre-write process.

With reference to FIG. 13, in Step S301, the block erase 2 command and which block is designated to be erased are output from CPU 2 and input to flash memory module 6. The block designated to be erased is any of memory mats MAT0-MAT3.

In Step S302, the second pre-write process shown in FIG. 14 is performed. Subsequently, in Steps S207-S213, an erase process similar to block erase 1 is performed.

With reference to FIG. 14, in Step S401, control circuit 120 sets to address ADR a leading address of the block to be erased. In accordance with address ADR, first row decoder RDEC1, second row decoder RDEC2, and column decoder CDEC select 32 twin cells TCs designated by the leading address and the following three addresses for a total of four addresses (in the present embodiment, one address is assigned 8 bits of data). Control circuit 120 sets MG, CG, and SL each to a read voltage shown in FIG. 5(a), and read 32 bits of twin cell data are transmitted to control circuit 120 via read sense amplifier SA, the output buffer, and data bus D(31:0).

In Step S402, column decoder CDEC turns on rewrite column selectors MC2GP and MC2GN by the C2 signal, and input/output circuit IOBUF sets via signal lines D0P and D0N write data of an inverted version of twin cell data read from the leading area of the block to be erased (i.e., a 32-bit area determined by the leading address and the following three addresses for the total of four addresses). More specifically, when the read twin cell data is "1", positive cell MCP has low threshold voltage Vth and negative cell MCN has high threshold voltage Vth. The second pre-write process allows only a cell with lower threshold voltage Vth, i.e., positive cell MCP, to have threshold voltage Vth increased. Furthermore, when the read twin cell data is "0", negative cell MCN has low threshold voltage Vth and positive cell MCP has high threshold voltage Vth. The second pre-write process allows only a cell with lower threshold voltage Vth, i.e., negative cell MCN, to have threshold voltage Vth increased.

For example, when the block to be erased has read from the leading area 32 bits of twin cell data that is 32 h'FFFFFFFF, the write data corresponding to the read twin cell data will be 32 h'00000000. For example, when the block to be erased has read from the leading area 32 bits of twin cell data that is 32 h'CCCCCCCC, the write data corresponding to the read twin cell data will be 32 h'33333333.

In Step S403, control circuit 120 starts a first write.

In Step S404, control circuit 120 sets MG, CG, and SL each to a write bias voltage (a voltage applied to increase Vth) shown in FIG. 5(a), and applies the write bias voltage to each of the selected 32 twin cells TCs at one memory cell to allow the 32 twin cells TCs to each have one memory cell with threshold voltage Vth increased. The write bias voltage is not applied to the other memory cell, and accordingly, its threshold voltage Vth is maintained.

To the leading area of the block to be erased (i.e., the 32-bit area designated by the leading address) is written an inverted version of the twin cell data read from the leading area of the block to be erased. The inverted version of the twin cell data read from the leading area of the block to be erased is also written to an area of the block to be erased other than the leading area.

In Step S405, the write is verified. More specifically, for write data of "0", positive verify sense amplifier VSP determines whether positive cell MCP has threshold voltage Vth exceeding second write verify voltage WVER2. For write data of "1", negative verify sense amplifier VSN determines whether negative cell MCN has threshold voltage Vth exceeding second write verify voltage WVER2.

In Step S406, when the 32 twin cells TCs have at least one thereof having a memory cell with threshold voltage Vth to be increased, with threshold voltage Vth equal to or lower than second write verify voltage WVER2, the process returns to Step S404. When the 32 twin cells TCs each have a memory cell with threshold voltage Vth to be increased, with threshold voltage Vth exceeding second write verify voltage WVER2, the process proceeds to Step S407.

In Step S407, control circuit 120 increments address ADR by one.

In Step S408, when address ADR is an intermediate address, the process proceeds to Step S407. When address ADR is not the intermediate address, the process returns to Step S403. The intermediate address is an address that specifies a leading 32-bit area of an intermediate area described later. Accordingly, the block to be erased, from the leading address to the address immediately preceding the intermediate address, has each area for every 32 bits subjected to a pre-write based on the inverted version of the data read from the leading area.

In Step S409, control circuit 120 sets to address ADR the intermediate address of the block to be erased. In accordance with address ADR, first row decoder RDEC1, second row decoder RDEC2, and column decoder CDEC select 32 twin cells TCs designated by the intermediate address. Control circuit 120 sets MG, CG, and SL each to a read voltage shown in FIG. 5(*a*), and read 32 bits of twin cell data are transmitted to control circuit 120 via read sense amplifier SA, the output buffer, and data bus D(31:0).

In Step S410, column decoder CDEC turns on rewrite column selectors MC2GP and MC2GN by the C2 signal, and input/output circuit IOBUF sets via signal lines D0P and D0N write data of an inverted version of twin cell data read from the intermediate area of the block to be erased (i.e., a 32-bit area determined by the intermediate address).

In Step S411, control circuit 120 starts a second write.

In Step S412, control circuit 120 sets MG, CG, and SL each to a write bias voltage (a voltage applied to increase Vth) shown in FIG. 5(*a*), and applies the write bias voltage to each of the selected 32 twin cells TCs at one memory cell to allow the 32 twin cells TCs to each have one memory cell with threshold voltage Vth increased. The write bias voltage is not applied to the other memory cell, and accordingly, its threshold voltage Vth is maintained.

To the intermediate area of the block to be erased is written an inverted version of the twin cell data read from the intermediate area of the block to be erased. The inverted version of the twin cell data read from the intermediate area of the block to be erased is also written to an area of the block to be erased other than the intermediate area.

In Step S413, the write is verified. More specifically, for write data of "0", positive verify sense amplifier VSP determines whether positive cell MCP has threshold voltage Vth exceeding second write verify voltage WVER2. For write data of "1", negative verify sense amplifier VSN determines whether negative cell MCN has threshold voltage Vth exceeding second write verify voltage WVER2.

In Step S414, when the 32 twin cells TCs have at least one thereof having a memory cell with threshold voltage Vth to be increased, with threshold voltage Vth equal to or lower than second write verify voltage WVER2, the process returns to Step S411. When the 32 twin cells TCs each have a memory cell with threshold voltage Vth to be increased, with threshold voltage Vth exceeding second write verify voltage WVER2, the process proceeds to Step S415.

In Step S415, control circuit 120 increments address ADR by one.

In step S416, when address ADR is (the final address +1), the process ends. When address ADR is not (the final address +1), the process returns to Step S411. More specifically, the block to be erased, from the intermediate area through to a 32-bit area designated by the final address, has each area for every 32 bits subjected to a pre-write based on the inverted version of the data read from the intermediate area.

Figure 15:
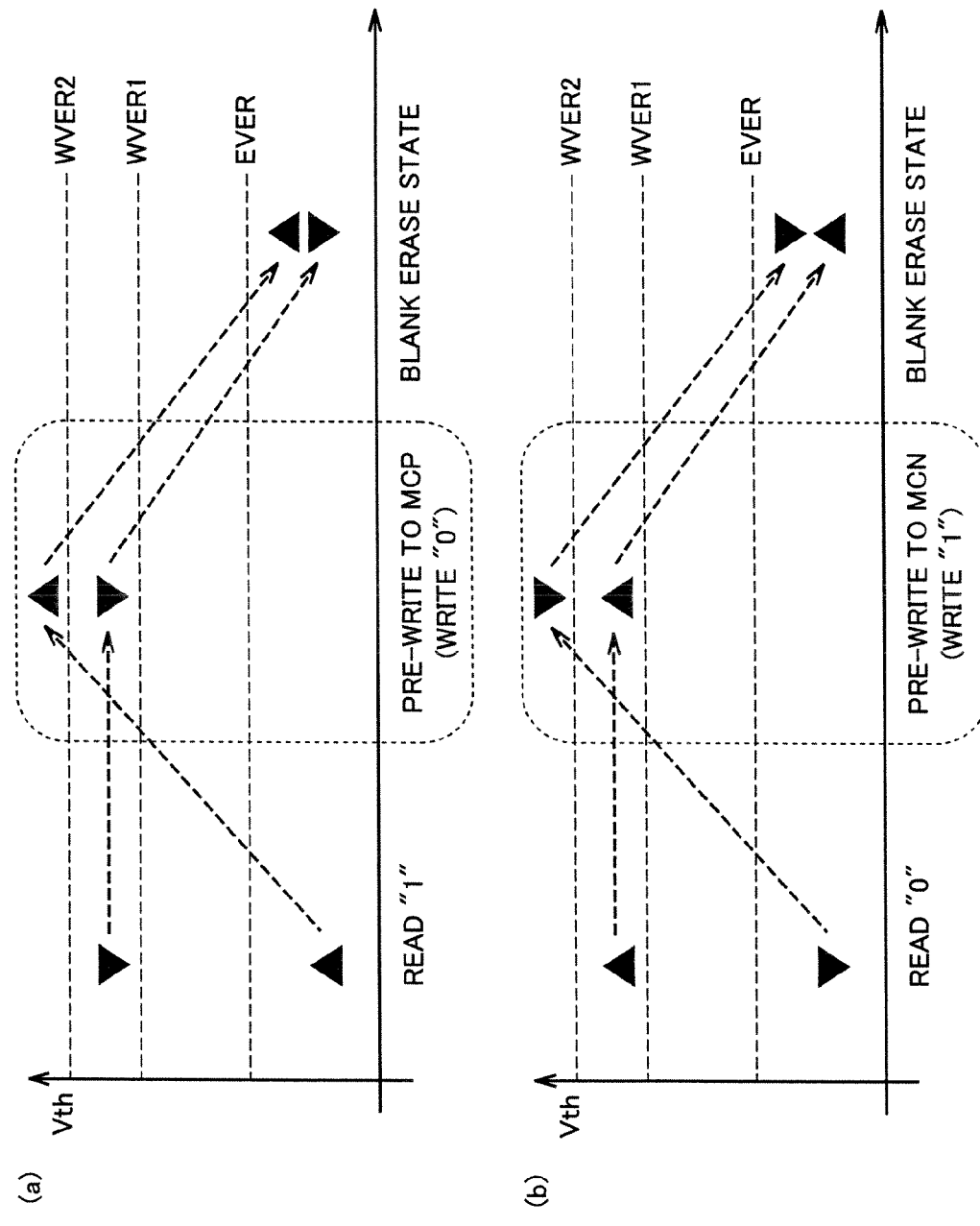
FIG. 15(*a*) and FIG. 15(*b*) show how a threshold voltage Vth varies when a leading area and an intermediate area are subjected to a second pre-write and subsequently to an erase process.

FIG. 15(*a*) shows how threshold voltage Vth varies when the leading and intermediate areas with data of "1" stored are subjected to the second pre-write process to have "0" written thereto and the areas are subsequently subjected to an erase process. FIG. 15(*b*) shows how threshold voltage Vth varies when the leading and intermediate areas with data of "0" stored are subjected to the second pre-write process to have "1" written thereto and the areas are subsequently subjected to the erase process.

Figure 16:
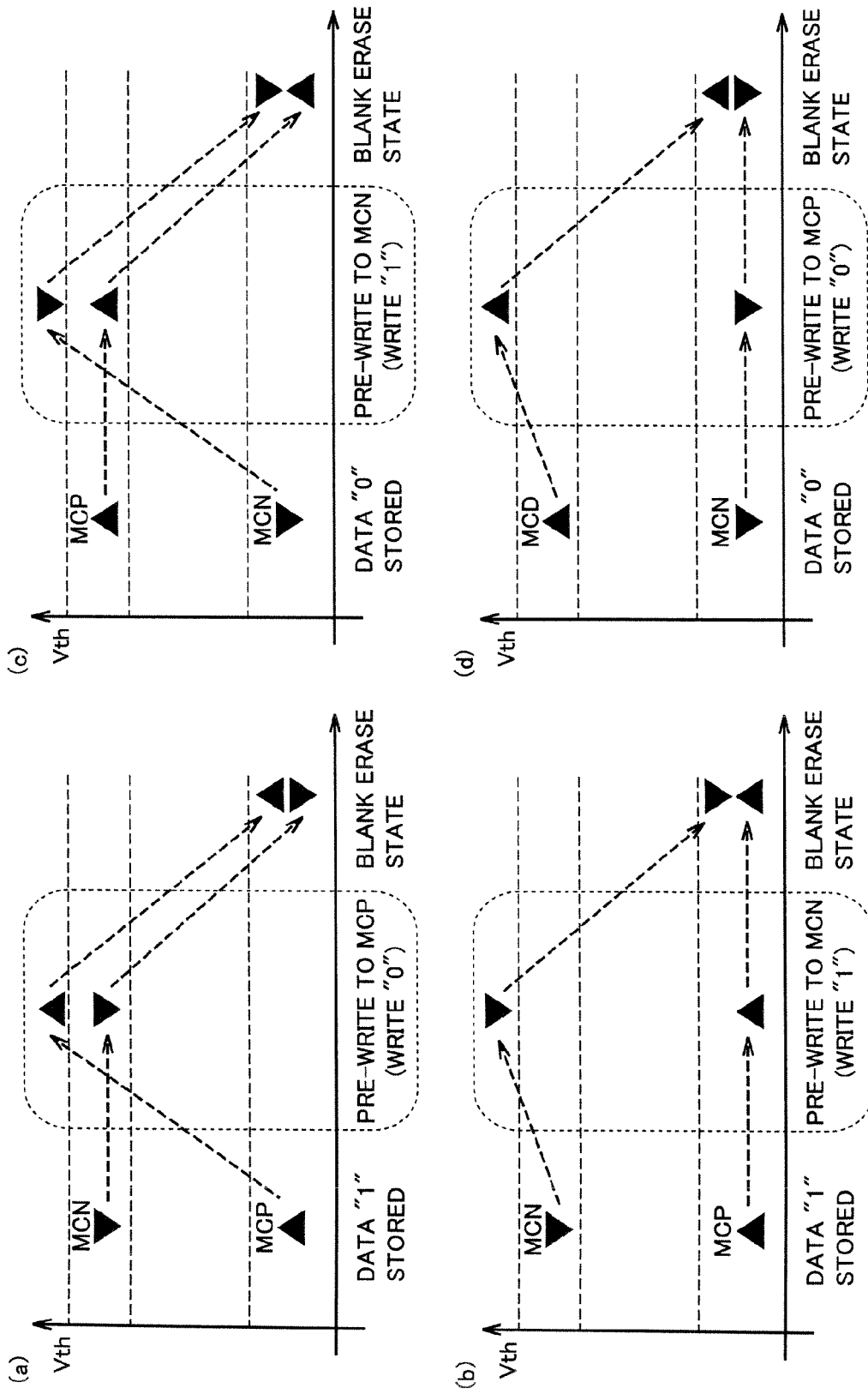
FIG. 16(*a*) to FIG. 16(*d*) show how threshold voltage Vth varies when an area other than the leading and intermediate areas is subjected to the second pre-write and subsequently to the erase process.

FIG. 16(*a*) shows how threshold voltage Vth varies when an area other than the leading and intermediate areas and having data of "1" stored therein is subjected to the second pre-write process to have "0" written thereto and the area is subsequently subjected to the erase process. FIG. 16(*b*) shows how threshold voltage Vth varies when the area other than the leading and intermediate areas and having data of "1" stored therein is subjected to the second pre-write process to have "1" written thereto and the area is subsequently subjected to the erase process. FIG. 16(*c*) shows how threshold voltage Vth varies when the area other than the leading and intermediate areas and having data of "0" stored therein is subjected to the second pre-write process to have "1" written thereto and the area is subsequently subjected to the erase process. FIG. 16(*d*) shows how threshold voltage Vth varies when the area other than the leading and intermediate areas and having data of "0" stored therein is subjected to the second pre-write process to have "0" written thereto and the area is subsequently subjected to the erase process.

As shown in FIG. 15 and FIG. 16, when block erase 2 ends, positive cell MCP and negative cell MCN do not have threshold voltage Vth maintained in a relationship in magnitude that the cells had had threshold voltage Vth in before the block erase was performed. If the relationship is maintained with several bits or addresses serving as a unit, it has lost continuity of write data as seen throughout a memory mat. Block erase 2 requires a longer period of time to read data than block erase 1 as described above, and accordingly, block erase 2 has a long execution time, however, it can advantageously protect confidential data.

Restoring Twin Cell Data

Microcomputer 1 has a restoration command mounted therein to restore twin cell data erased by the block erase 1 command inadvertently.

Figure 17:
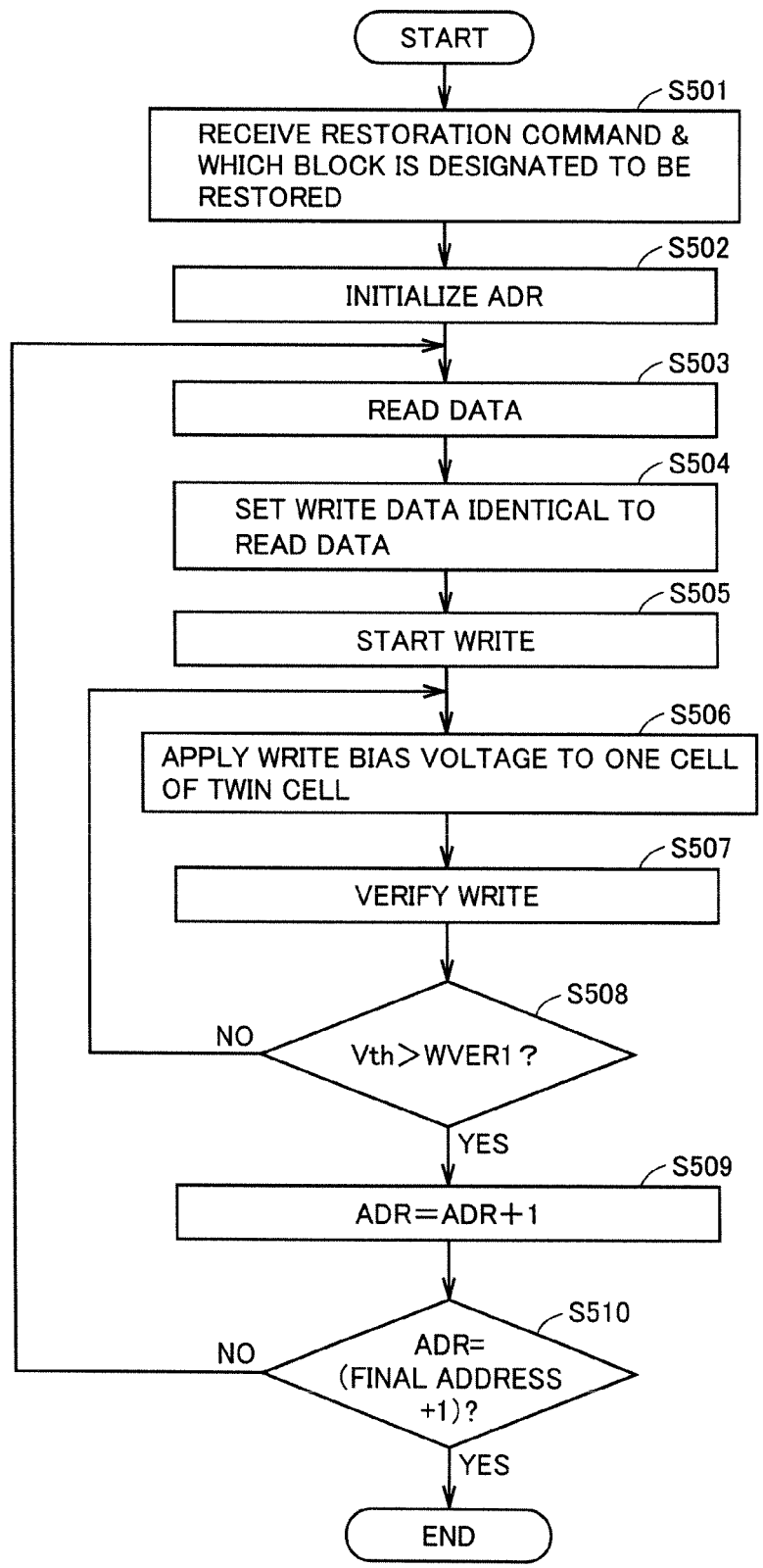
FIG. 17 is a flowchart of a procedure of restoring twin cell data according to the second embodiment.

FIG. 17 is a flowchart of a procedure of restoring twin cell data according to the second embodiment.

In Step S501, the restoration command and which block is designated to be restored are output from CPU 2 and input to flash memory module 6. The block designated to be restored is any of memory mats MAT0-MAT3.

In Step S502, control circuit 120 sets to address ADR a leading address of the block to be restored.

In Step S503, in accordance with address ADR, first row decoder RDEC1, second row decoder RDEC2, and column decoder CDEC select 32 twin cells TCs designated by address ADR and the following three addresses for a total of four addresses. Control circuit 120 sets MG, CG, and SL each to a read voltage shown in FIG. 5(*a*), and read 32 bits of twin cell data are transmitted to control circuit 120 via read sense amplifier SA, the output buffer, and data bus D(31:0). Even in the blank erase state, if negative cell MCN is higher in threshold voltage Vth than positive cell MCP, the read twin cell data is determined to be "1", whereas if negative cell MCP is higher in threshold voltage Vth than positive cell MCN, the read twin cell data is determined to be "0".

In Step S504, column decoder CDEC turns on rewrite column selectors MC2GP and MC2GN by the C2 signal, and input/output circuit IOBUF sets write data that is identical to the read twin cell data to positive write data latch circuit WDLP and negative write data latch circuit WDLN via signal lines D0P and D0N. More specifically, when the read twin cell data is "1", positive cell MCP has low threshold voltage Vth and negative cell MCN has high threshold voltage Vth, and accordingly, input/output circuit IOBUF sets write data to "1" to increase only negative cell MCN's threshold voltage Vth. Furthermore, when the read twin cell data is "0", negative cell MCN has low threshold voltage Vth and positive cell MCP has high threshold voltage Vth, and accordingly, input/output circuit IOBUF sets write data to "0" to increase only positive cell MCP's threshold voltage Vth.

In Step S505, control circuit 120 starts a write.

In Step S506, control circuit 120 applies a write bias voltage to the twin cells TCs through MBL, SBL, SG, MG, SL, and WELL that are selected to allow the twin cells TCs to each have one memory cell with threshold voltage Vth increased.

In Step S507, the write is verified. More specifically, for write data of "0", positive verify sense amplifier VSP determines whether positive cell MCP has threshold voltage Vth exceeding first write verify voltage WVER1. For write data of "1", negative verify sense amplifier VSN determines whether negative cell MCN has threshold voltage Vth exceeding first write verify voltage WVER1.

In Step S508, when the 32 twin cells TCs have at least one thereof having a memory cell with threshold voltage Vth to be increased, with threshold voltage Vth equal to or lower than first write verify voltage WVER1, the process returns to Step S506. When the 32 twin cells TCs each have a memory cell with threshold voltage Vth to be increased, with threshold voltage Vth exceeding first write verify voltage WVER1, the process proceeds to Step S509.

In Step S509, control circuit 120 increments address ADR by one. In step S510, when address ADR is (the final address +1), the process ends. When address ADR is not (the final address +1), the process returns to Step S503.

Control circuit 120 thus performs the erase process in response to the second erase command so that a plurality of twin memory cells to be erased have at least some thereof with one or two or more memory cells placed in an erased state that inverts in magnitude a relationship in threshold value that its or their paired positive and negative cells had before the cells underwent a pre-write when the cells had data written therein. More specifically, the pre-write applies a write bias voltage to the plurality of twin memory cells concurrently and at least any one thereof is placed in an erased state to have its paired positive and negative cells with their respective threshold values in a relationship inverted in magnitude.

On the other hand, when the first erase command is executed to perform an erase process to erase a plurality of twin memory cells to be erased, the erase process basically does not change in magnitude the relationship in threshold value that the paired positive and negative cells had before the cells underwent the pre-write when the cells had data written therein. The second erase command allows the erase process to be performed to allow more pairs of cells to have threshold values in a relationship inverted in magnitude than the first erase command does. When the second erase command is executed to subject a plurality of twin cells to an erase process, the plurality of twin cells have a data value, and when reading data is attempted, the data value has a larger number of bits different from those of a data value that the plurality of twin cells had before the erase than when the first erase command is executed. The second erase command allows data to be erased less reproducibly than the first erase command to keep the confidentiality that the data had had before it was erased.

Thus the present embodiment, as well as the first embodiment, allows the first erase command to be used to allow a user to erase twin cell data to simply, additionally write data and a second erase command to be used to allow the user to erase twin cell data that the user desires to keep confidential.

Furthermore, the restoration command can be executed to restore original data from the blank erase state provided after the first erase command is executed.

Third Embodiment

The second pre-write process in block erase 2 and the restoration process that have been described in the first and second embodiments are controlled by control circuit 120 internal to flash memory module 6. This requires control circuit 120 internal to flash memory module 6 to have mounted therein a function of the second pre-write process in block erase 2 and the restoration process. The present embodiment allows CPU 2 to execute a pre-write program in block erase 2 and a restoration program to allow the second pre-write and the restoration to be provided if control circuit 120 internal to flash memory module 6 does not have mounted therein the function of the second pre-write and restoration processes.

FIG. 18 shows a procedure of a process of the pre-write program.

The process starts in Step 0.

In Step 1, CPU 2 sets in control circuit 120 at a register 131 a value indicating supplying positive verify sense amplifier VSP and negative verify sense amplifier VSN with second write verify voltage WVER2 as a reference voltage. Note that register 131 has a default value set therein to indicate supplying positive verify sense amplifier VSP and negative verify sense amplifier VSN with first write verify voltage WVER1 as a reference voltage.

In Step 2, CPU 2 sets address ADR to a leading address of a block to be erased.

In Step 3, CPU 2 outputs a read instruction formed of a read command Read and address ADR. Control circuit 120 receives the command, and in response thereto reads twin cell data of 32 twin cells TCs designated by address ADR and the following three addresses for a total of four addresses and outputs the read data to CPU 2. The twin cell data output from control circuit 120 serves as DATA of 32 bits.

In Step 4, CPU 2 outputs a program instruction formed of a programming command Write, address ADR, and data /DATA. Control circuit 120 receives the command, and in response thereto writes data of 32 bits /DATA to the 32 twin cells TCs designated by address ADR and the following three addresses for the total of four addresses. /DATA is DATA read in Step 3 having each bit inverted. Verify sense amplifiers VSP and VSN are supplied with second write verify voltage WVER2 by the setting of register 131, and accordingly, the write process continues until each twin cell TC has either positive cell MCP or negative cell MCN with threshold voltage Vth exceeding second write verify voltage WVER2.

In Step 5, CPU 2 increments address ADR by one.

In Step 6, when address ADR is (an intermediate address +4) of the block to be erased, CPU 2 proceeds to Step 7. When address ADR is not the intermediate address of the block to be erased, CPU 2 returns to Step 4.

In Step 7, CPU 2 outputs a read instruction formed of read command Read and address ADR. Control circuit 120 receives the command, and in response thereto reads twin cell data of 32 twin cells TCs designated by address ADR and the following three addresses for a total of four addresses and outputs the read data to CPU 2. The twin cell data output from control circuit 120 serves as DATA of 32 bits.

In Step 8, CPU 2 outputs a program instruction formed of programming command Write, address ADR, and data /DATA. Control circuit 120 receives the command, and in response thereto writes data of 32 bits /DATA to the 32 twin cells TCs designated by address ADR and the following three addresses for the total of four addresses. /DATA is DATA read in Step 7 having each bit inverted.

In Step 9, CPU 2 increments address ADR by one.

In Step 10, when address ADR is (the final address +4) of the block to be erased, CPU 2 ends the process. When address ADR is not (the final address +1) of the block to be erased, CPU 2 returns to Step 8.

FIG. 19 shows a procedure of a process of the restoration program.

The process starts in Step 0.

In Step 1, CPU 2 sets address ADR to a leading address of a block to be restored.

In Step 2, CPU 2 outputs a read instruction formed of read command Read and address ADR. Control circuit 120 receives the command, and in response thereto reads twin cell data of 32 twin cells TCs designated by address ADR and the following three addresses for a total of four addresses and outputs the read data to CPU 2. The twin cell data output from control circuit 120 serves as DATA of 32 bits.

In Step 3, CPU 2 outputs a program instruction formed of programming command Write, address ADR, and data DATA. Control circuit 120 receives the command, and in response thereto writes DATA of 32 bits to the 32 twin cells TCs designated by address ADR and the following three addresses for the total of four addresses. DATA is identical to DATA read in Step 2. Verify sense amplifiers VSP and VSN are supplied with first write verify voltage WVER1, and accordingly, the write process continues until each twin cell TC has either positive cell MCP or negative cell MCN with threshold voltage Vth exceeding first write verify voltage WVER1.

In Step 4, CPU 2 increments address ADR by one.

In Step 5, when address ADR is (the final address +4) of the block to be erased, CPU 2 ends the process. When address ADR is not (the final address +1) of the block to be erased, CPU 2 returns to Step 2.

The program of block erase 2 and the restoration program are stored in any of memory mats MAT0-MAT3 of flash memory module 6 shown in FIG. 4, and before block erase 2 and the restoration process are performed, the programs are transferred to RAM 5 of FIG. 3 and read and executed by CPU 2. Alternatively, the block erase 2 program and the restoration program may be written to RAM 5 by a device (e.g., a writer) external to microcomputer 1 through an input/output port internal to microcomputer 1.

The present embodiment thus allows flash memory module 6 to have control circuit 120 therein without having the function of the second pre-write and restoration processes mounted therein, as CPU 2 executes a pre-write program and a restoration program to provide block erase 2 and restoration similarly as provided in the second embodiment.

The present invention is not limited to the above embodiments and also for example includes such an exemplary variation as follows:

(1) Write Data in Block Erase 2

While the present invention in an embodiment provides block erase 2 such that a block to be erased has data read from a leading area thereof and inverted, and thus written to the first half of the block and the block also has data read from an intermediate area thereof and inverted, and thus written to the second half of the block, the present invention is not limited thereto.

The block to be erased may be divided into N areas which may in turn each have data read from a leading area thereof and inverted, and thus written throughout that area. Alternatively, the block to be erased may have data read from a leading area thereof and inverted, and thus written throughout the entire area of the block. Alternatively, the block to be erased may have data read from each area thereof and inverted, and thus written to that area. The block to be erased may not have data read therefrom and may instead have random data written thereto.

(2) Write Verify Voltage of Second Pre-Write Process

While the present invention in an embodiment provides the second pre-write process such that whether a memory cell that has threshold voltage Vth to be increased has threshold voltage Vth exceeding second write verify voltage WVER2 is determined, the present invention is not limited thereto, and whether the memory cell that has threshold voltage Vth to be increased has threshold voltage Vth exceeding first write verify voltage WVER1 may instead be determined. Although using first write verify voltage WVER1 provides a larger probability than using second write verify voltage WVER2 of positive and negative cells MCP and MCN having undergone block erase 2 having threshold voltage Vth maintained in a relationship in magnitude that the cells had had threshold voltage Vth in before the cells underwent block erase 2, the former never allows the cells to maintain threshold voltage Vth completely in the relationship in magnitude that the cells had had threshold voltage Vth in before the cells underwent block erase 2. If having threshold voltage Vth in a relationship in magnitude that is only slightly different from that before block erase 2 was performed suffices, the second pre-write process may be done such that whether the memory cell that has threshold voltage Vth to be increased has threshold voltage Vth exceeding first write verify voltage WVER1 is determined.

(3) Mounting Block Erase 2 Alone

If the above embodiments provide the flash memory module to only handle confidential data, the flash memory module may not have block erase 1 (or its pre-write program) or the restoration process (or its restoration program) mounted therein.

(4) Mounting Block Erase 1 and Restoration Process Alone

The flash memory module may not have block erase 2 (or its pre-write program) mounted therein for a user who does not require erasing confidential data.

While the present invention has been specifically described above in embodiments, the present invention is not limited to the embodiments and is variable within a range that does not depart from the gist of the present invention.

REFERENCE SIGNS LIST

1: microcomputer (MCU); 2: central processing unit (CPU); 3: direct memory access controller (DMAC); 4: bus interface circuit (BIF); 5: random access memory (RAM); 6: flash memory module (FMDL); 7: flash sequencer (FSQC); 8, 9: external input/output port (PRT); 10: timer (TMR); 11: clock pulse generator (CPG); 91, 93: data holding unit; 92, 94: setting unit; RDEC1: first row decoder; RDEC2: second row decoder; IOBUF: input/output circuit; CDEC: column decoder; VPG: power supply circuit; TMG: timing generator; 100: semiconductor device; 101, MARY: memory array; 102: first storage device; 103: second storage device; 104: twin cell; 105, 120: control circuit; 121: read sense amplifier circuit; 122: Y select unit; 123: write latch unit; 124: verify unit; 131: register; P1-P6: p channel MOS transistor; N1-N6: n channel MOS transistor; IV1-IV4: inverter; HACSP: high-speed access port; LACSP: low-speed access port; HBUS: high-speed bus; PBUS: peripheral bus; MAT0-

MAT3: memory mat; SA: read sense amplifier; VSP: positive verify sense amplifier; VPN: negative verify sense amplifier; VERC: verify circuit; WDLP: positive write data latch circuit; WDLN: negative write data latch circuit; MC1GP, MC1GN: verify selector; MC2GP, MC2GN: rewrite column selector; SELP, SELN: sub bit line selector; YSELP, YSELN: Y selector; B0-B31: buffer; TC: twin cell; MCP, MCN: nonvolatile memory cell; MBLP, MBLN: main bit line; WL: word line; SBLP, SBLN: sub bit line; MGL: memory gate select line.

The invention claimed is:

1. A semiconductor device comprising:
a memory array including a plurality of twin cells each formed of electrically rewritable, first and second storage devices holding binary data depending on a difference between a threshold voltage of said first storage device and a threshold voltage of said second storage device; and
a control circuit that controls erasing twin cell data held in said twin cells,
when said control circuit has received a first erase command, said control circuit controlling performing a first pre-write process to allow said first storage device and said second storage device to have their respective threshold voltages both increased, said control circuit thereafter controlling performing an erase process to allow said first storage device and said second storage device to have their respective threshold voltages both decreased to be smaller than a prescribed erase verify level, whereas when said control circuit has received a second erase command, said control circuit controlling performing a second pre-write process to allow one of said first storage device and said second storage device to have its threshold voltage increased, said control circuit thereafter controlling performing said erase process.

2. The semiconductor device according to claim 1, wherein:
when said control circuit has received a programming command, said control circuit increases the threshold voltage of one of said first storage device and said second storage device to exceed a first write verify voltage; and
when said control circuit has received said second erase command, said control circuit increases the threshold voltage of one of said first storage device and said second storage device to exceed a second write verify voltage, said second write verify voltage being larger than said first write verify voltage.

3. The semiconductor device according to claim 1, wherein when said control circuit has received said second erase command, said control circuit reads twin cell data from a prescribed twin cell in said memory array, and when said twin cell data indicates that the threshold voltage of said first storage device is larger than the threshold voltage of said second storage device, said control circuit increases the threshold voltage of said second storage device of said prescribed twin cell in said memory array and that of said second storage device of another twin cell in said memory array, whereas when said twin cell data indicates that the threshold voltage of said second storage device is larger than the threshold voltage of said first storage device, said control circuit increases the threshold voltage of said first storage device of said prescribed twin cell in said memory array and that of said first storage device of another twin cell in said memory array.

4. The semiconductor device according to claim 3, wherein:
when said control circuit has received said second erase command, said control circuit reads twin cell data from a twin cell in a leading area of a block to be erased in said memory array, and when said twin cell data indicates that the threshold voltage of said first storage device is larger than the threshold voltage of said second storage device, said control circuit increases the threshold voltage of said second storage device of each said twin cell in said memory array from said leading area through to an area of said block immediately preceding an intermediate area of said block, whereas when said twin cell data indicates that the threshold voltage of said second storage device is larger than the threshold voltage of said first storage device, said control circuit increases the threshold voltage of said first storage device of each said twin cell in said memory array from said leading area through to said area immediately preceding said intermediate area; and
said control circuit reads twin cell data from a twin cell in said intermediate area of said block to be erased in said memory array, and when said twin cell data indicates that the threshold voltage of said first storage device is larger than the threshold voltage of said second storage device, said control circuit increases the threshold voltage of said second storage device of each said twin cell in said memory array from said intermediate area through to a final area of said block, whereas when said twin cell data indicates that the threshold voltage of said second storage device is larger than the threshold voltage of said first storage device, said control circuit increases the threshold voltage of said first storage device of each said twin cell in said memory array from said intermediate area through to an area of said block immediately preceding said final area.

5. The semiconductor device according to claim 1, wherein when said control circuit has received said first erase command and thereafter, further received a restoration command, said control circuit reads twin cell data from said twin cell, and when said twin cell data indicates that the threshold voltage of said first storage device is larger than the threshold voltage of said second storage device, said control circuit increases the threshold voltage of said first storage device of said twin cell, whereas when said twin cell data indicates that the threshold voltage of said second storage device is larger than the threshold voltage of said first storage device, said control circuit increases the threshold voltage of said second storage device of said twin cell.

6. The semiconductor device according to claim 1, wherein:
a relationship in magnitude before the second pre-write process between the threshold of the first storage device and the threshold of the second storage device is not maintained after the erase process.

* * * * *